United States Patent
Shin et al.

(10) Patent No.: US 11,915,781 B2
(45) Date of Patent: Feb. 27, 2024

(54) APPARATUSES AND METHODS FOR ZQ CALIBRATION

(71) Applicant: SAMSUNG ELECTRONICS CO., LTD., Suwon-si (KR)

(72) Inventors: Dongho Shin, Yongin-si (KR); Jungjune Park, Seoul (KR); Kyoungtae Kang, Seoul (KR); Chiweon Yoon, Seoul (KR); Junha Lee, Seoul (KR); Byunghoon Jeong, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/938,214

(22) Filed: Oct. 5, 2022

(65) Prior Publication Data

US 2023/0138561 A1    May 4, 2023

(30) Foreign Application Priority Data

Nov. 3, 2021    (KR) .................. 10-2021-0149952

(51) Int. Cl.
    *G11C 7/10*    (2006.01)
    *H03K 19/00*    (2006.01)

(52) U.S. Cl.
    CPC ....... *G11C 7/1051* (2013.01); *H03K 19/0005* (2013.01); *G11C 2207/2254* (2013.01)

(58) Field of Classification Search
    CPC ....... H03K 19/0005; H03K 19/017545; H03K 19/018557; G11C 7/1051; G11C 2207/2254; H04L 25/0278
    See application file for complete search history.

(56) References Cited

U.S. PATENT DOCUMENTS

| | | | |
|---|---|---|---|
| 7,420,387 B2 | 9/2008 | Lee et al. | |
| 8,271,810 B1 | 9/2012 | Fliesler et al. | |
| 9,825,631 B1 | 11/2017 | Cho et al. | |
| 10,256,817 B2* | 4/2019 | Gans | G11C 11/4093 |
| 10,361,699 B2 | 7/2019 | Lee et al. | |
| 10,747,245 B1 | 8/2020 | He et al. | |
| 2012/0306543 A1 | 12/2012 | Matsuoka | |
| 2020/0195121 A1 | 6/2020 | Keskar et al. | |
| 2021/0027827 A1 | 1/2021 | Kim et al. | |
| 2021/0149423 A1* | 5/2021 | He | G11C 7/1057 |
| 2021/0335406 A1 | 10/2021 | Agrawal et al. | |

FOREIGN PATENT DOCUMENTS

KR    10-0575006 B1    4/2006

OTHER PUBLICATIONS

Extended European Search Report dated Jun. 16, 2023, issued by European Patent Office in European Patent Application No. 22193599.2.

* cited by examiner

*Primary Examiner* — Anh Q Tran

(74) *Attorney, Agent, or Firm* — Sughrue Mion, PLLC

(57) ABSTRACT

An apparatus and method for ZQ calibration, including determining a strong driver circuit and a weak driver circuit, which are related to an input/output (I/O) circuit connected to a signal pin, at power-up of the I/O circuit; providing a ZQ calibration code related to a sweep code to one from among the strong driver circuit and the weak driver circuit according to ZQ calibration conditions; and providing a ZQ calibration code related to a fixed code to an unselected circuit, thereby adjusting a termination resistance of the signal pin.

20 Claims, 23 Drawing Sheets

APPARATUSES AND METHODS FOR ZQ CALIBRATION

CROSS-REFERENCE TO RELATED APPLICATION

This application is based on and claims priority under 35 U.S.C. § 119 to Korean Patent Application No. 10-2021-0149952, filed on Nov. 3, 2021, in the Korean Intellectual Property Office, the disclosure of which is incorporated by reference herein in its entirety.

BACKGROUND

1. Field

The disclosure relates to semiconductor devices, and more particularly, to ZQ calibration apparatuses and methods allowing impedance matching to be performed according to a wide range of process, voltage, temperature (PVT) conditions.

2. Description of Related Art

Semiconductor devices may include a transmitter/receiver in a high-speed input/output (I/O) interface, e.g., a serial interface. A serial interface may sequentially transmit a plurality of bits one-by-one through a single line. The output impedance of a transmitter may vary with a variation in device characteristics during semiconductor manufacturing processes, a variation in the conditions of voltage applied to an element of a circuit, and a variation in the ambient temperature of a circuit. When the output impedance of a transmitter does not match the impedance of a receiver, signal reflection may occur in the receiver. The reflected signal may be inappropriately transmitted, and the voltage level thereof may be changed in the receiver. As a result, the signal may not be transmitted normally.

Semiconductor devices are increasingly affected by variations in a process, a power supply voltage, and/or temperature, i.e., PVT variations, and signal reflection caused by impedance variations or mismatch in interfaces worsens. Therefore, impedance calibration is necessary. Semiconductor devices include a ZQ pin, receive a ZQ calibration command from the outside, and perform ZQ calibration, thereby controlling impedance matching.

A transmitter may transmit a signal through a driver connected to a signal line. At this time, the driver may include heterogeneous elements, taking into account the operating characteristics of transistors. For example, a pull-up driver connected between a power supply voltage line and a signal line may include a P-channel metal-oxide semiconductor (PMOS) transistor and an N-channel MOS (NMOS) transistor. The power supply voltage level of semiconductor devices may decrease to support low-power performance. Nevertheless, a transmitter needs to accurately perform ZQ calibration according to the low power supply voltage level. Even under the condition of a wide voltage range from a low power supply voltage level to a high power supply voltage level, a transmitter needs to accurately perform ZQ calibration according to the low power supply voltage level. Accordingly, semiconductor devices may maintain impedance matching even though a power supply voltage level is changed.

SUMMARY

Provided are methods and apparatuses for ZQ calibration, by which impedance matching is performed according to a wide range of process, voltage, temperature (PVT) conditions.

Additional aspects will be set forth in part in the description which follows and, in part, will be apparent from the description, or may be learned by practice of the presented embodiments.

In accordance with an aspect of the disclosure, an apparatus includes an input/output (I/O) circuit connected to a signal pin, the I/O circuit including a strong driver circuit and a weak driver circuit, wherein the strong driver circuit is stronger than the weak driver circuit; an impedance control (ZQ) calibration circuit connected to a ZQ pin, and configured to perform ZQ calibration using a sweep code or a fixed code, the ZQ pin being connected to a ZQ resistor, the sweep code being updated in a calibration operation related to the ZQ pin, and the fixed code being stored in a register; and a ZQ calibration control circuit connected to the I/O circuit and the ZQ calibration circuit, and configured to: generate a ZQ calibration code signal according to ZQ calibration conditions, based on the sweep code or the fixed code, select a driver circuit from among the strong driver circuit and the weak driver circuit based on the ZQ calibration conditions, adjust a termination resistance of the signal pin by providing a ZQ calibration code related to the sweep code to the selected driver circuit, and provide a ZQ calibration code related to the fixed code to an unselected circuit from among the strong driver circuit and the weak driver circuit.

In accordance with an aspect of the disclosure, an apparatus includes an input/output (I/O) circuit connected to a signal pin, the I/O circuit including a first driver circuit and a second driver circuit; an impedance control (ZQ) calibration circuit connected to a ZQ pin connected to a ZQ resistor; and a ZQ calibration control circuit connected to the I/O circuit, wherein, based on a strength selection signal set in ZQ calibration conditions having a first logic level, the ZQ calibration control circuit is configured to: provide a sweep code to a stronger driver circuit from among the first driver circuit and the second driver circuit, the sweep code being updated by a calibration operation of the ZQ calibration circuit, and provide a fixed code to a weaker driver circuit from among the first driver circuit and the second driver circuit, the fixed code being stored in a register.

In accordance with an aspect of the disclosure, a method of performing impedance control (ZQ) calibration on an input/output (I/O) circuit includes identifying a strong driver circuit and a weak driver circuit included in the I/O circuit, wherein the strong driver circuit is stronger than the weak driver circuit; performing ZQ calibration with respect to a ZQ pin connected to a ZQ resistor using a sweep code or a fixed code, the sweep code being updated in a calibration operation related to the ZQ pin, and the fixed code being stored in a register; and providing the sweep code to the strong driver circuit and the fixed code to the weak driver circuit, based on a strength selection signal set according to ZQ calibration conditions.

In accordance with an aspect of the disclosure, an apparatus includes an input/output (I/O) circuit connected to a signal pin, the I/O circuit including a first driver circuit having a first drive strength and a second driver circuit having a second drive strength different from the first drive strength; a ZQ calibration control circuit connected to the I/O circuit, wherein, based on the first drive strength being stronger than the second drive strength, the ZQ calibration control circuit is configured to: determine a selected driver circuit from among the first driver circuit and the second driver circuit based on a comparison between the first drive strength and the second drive strength, adjust a termination resistance of the signal pin by providing an adjusted ZQ calibration code to the selected driver circuit, and provide a fixed ZQ calibration code to an unselected circuit from among the first driver circuit and the second driver circuit.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF THE EMBODIMENTS

Figure 1:
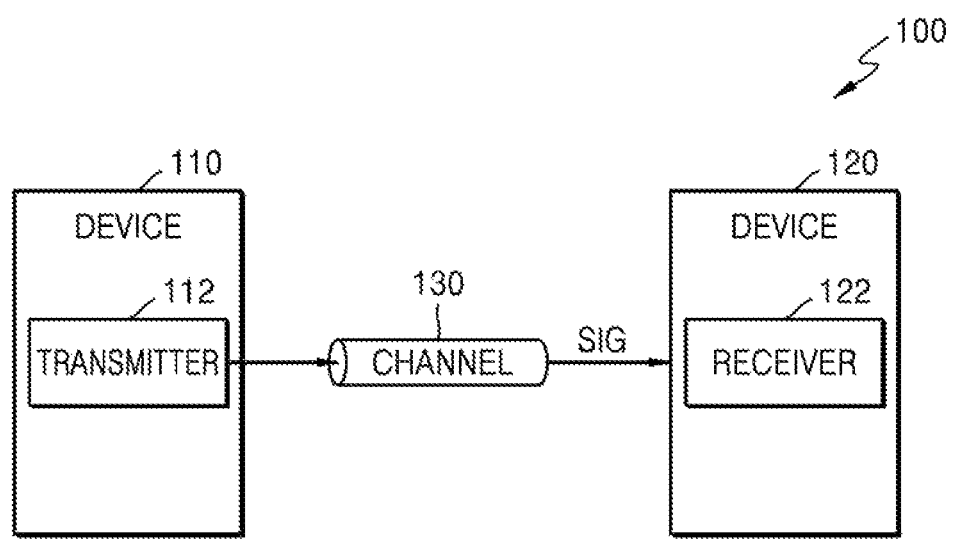
FIG. 1 is a block diagram of an apparatus including a transmitter and a receiver, according to an embodiment.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

FIG. 1 is a block diagram of an apparatus including a transmitter and a receiver, according to example embodiments.

Referring to FIG. 1, an apparatus 100 may include a first device 110 and a second device 120. The apparatus 100 may be included in a personal computer (PC) or a mobile electronic device. A signal may be transmitted between the first device 110 and the second device 120 through a channel 130. The channel 130 may include a signal line, which physically or electrically connects the first device 110 to the second device 120. The opposite ends of the channel 130 may be respectively connected to a pin of the first device 110 and a pin of the second device 120. The term "pin" may indicate electrical interconnection with respect to an integrated circuit and includes, for example, a pad or another electrical contact point in an integrated circuit. For simplicity of illustration, FIG. 1 shows that signals are transmitted between the first device 110 and the second device 120 through a single signal line, but embodiments are not limited thereto, and signals may be transmitted through a plurality of signal lines or a bus.

The first device 110 may include a transmitter 112, and the transmitter 112 may transmit an output signal SIG to the second device 120 through the channel 130. The transmitter 112 may transmit the output signal SIG including serialized bits to a receiver 122 through the channel 130. The second device 120 may include the receiver 122, and the receiver 122 may receive the output signal SIG through the channel 130. The receiver 122 may be configured to perform an operation, which corresponds to the function of the output signal SIG, in a semiconductor device including the receiver 122.

For example, the first device 110 may correspond to a memory device. The memory device may include a non-volatile memory device or a volatile memory device. As a non-limiting example, the non-volatile memory device may include flash memory, phase-change random access memory (PRAM), resistance RAM (RRAM), magnetic RAM (MRAM), ferroelectric RAM (FRAM), electrically erasable programmable read-only memory (EEPROM), nano floating gate memory (NFGM), polymer RAM (PoRAM), or the like. As a non-limiting example, the volatile memory device may include dynamic RAM (DRAM), static RAM (SRAM), mobile DRAM, double data rate Synchronous DRAM (DDR SDRAM), low power DDR (LPDDR) SDRAM, graphic DDR (GDDR) SDRAM, Rambus DRAM (RDRAM), high bandwidth memory (HBM), or the like.

The second device 120 may correspond to a memory controller performing a memory control function and may include an integrated circuit (IC), a system-on-chip (SoC), an application processor (AP), a mobile AP, a chipset, or a group of chips. The AP may include a memory controller, RAM, a central processing unit (CPU), a graphics processing unit (GPU), and/or a modem.

The second device 120 may control the first device 110 to read data therefrom or write data thereto in response to a read/write request of a host. The second device 120 may control a data write and/or read operation of the first device 110 by providing a clock signal, a command signal, and/or an address signal to the first device 110. The first device 110 may receive a clock signal, a command signal, and/or an address signal from the second device 120 and generate an internal signal corresponding to the function of the clock signal, the command signal, and/or the address signal. The first device 110 may perform a memory operation, such as selecting a row and a column corresponding to a memory cell, writing data to a memory cell, or reading data from a memory cell, using the internal signal.

Figure 2:
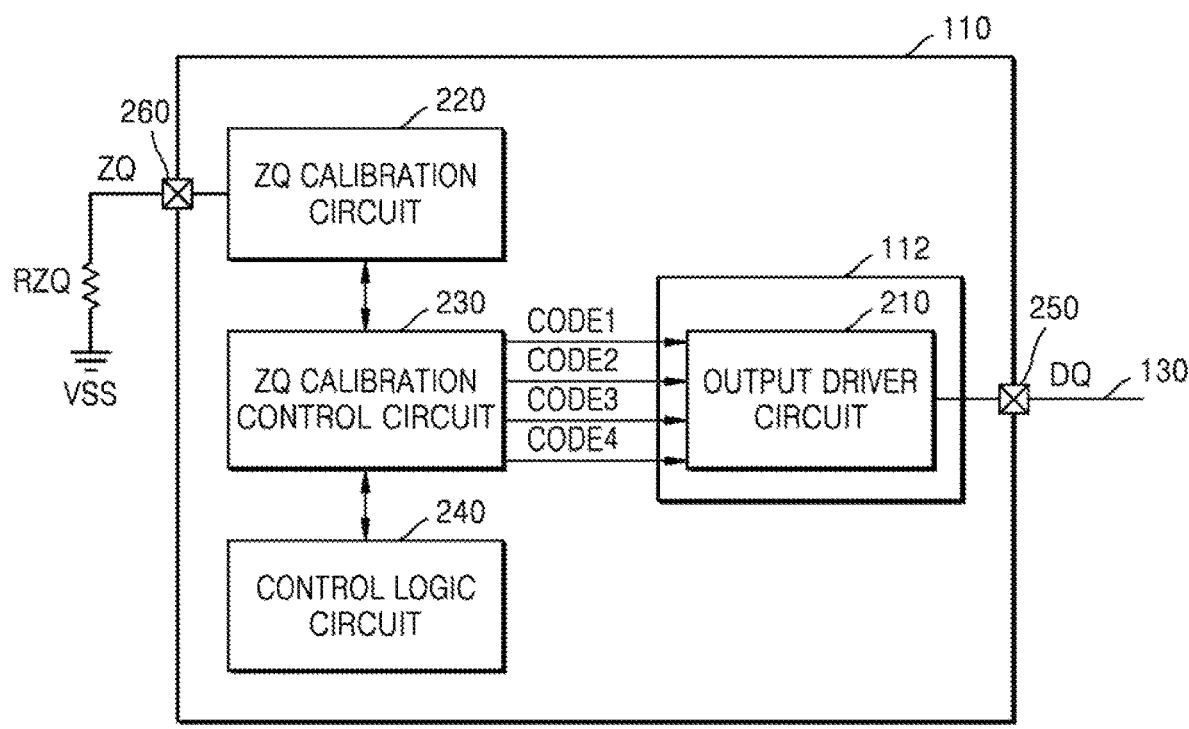
FIG. 2 is a block diagram of a first device according to an embodiment.

FIG. 2 is a block diagram of the first device 110 according to example embodiments.

Referring to FIG. 2, the first device 110 may include a plurality of input/output (I/O) pins. The I/O pins may include data pins, which may be referred to as DQ pins, impedance control pins, which may be referred to as ZQ pins, and also may include command pins and address pins. The first device 110 may include a ZQ pin 260 and a DQ pin 250 connected to the channel 130. For simplicity of illustration, FIG. 2 shows the transmitter 112 connected to one DQ pin 250 among a plurality of DQ pins, however embodiments are not limited thereto.

The ZQ pin 260 may be connected to a ground voltage VSS through an external resistor RZQ, and the external resistor RZQ may be provided on a memory module board or a motherboard. The external resistor RZQ, as a reference resistance during ZQ calibration, may be about 300Ω. The DQ pin 250 may transmit, to the channel 130, data DQ read from a memory cell of the first device 110 and receive, through the channel 130, the data DQ to be written to the memory cell.

The first device 110 may include the transmitter 112, which includes an output driver circuit 210 connected to the DQ pin 250, a ZQ calibration circuit 220, a ZQ calibration control circuit 230, and a control logic circuit 240. A plurality of hardware components included in the first device 110 are illustrated in FIG. 2, however embodiments are not limited to the illustrated components, and the first device 110 may include other components. The output driver circuit 210 outputs the data DQ to a DQ line of the channel 130 in an embodiment below, but embodiments are not limited thereto. For example, the DQ pin 250 may receive the data DQ through a DQ line, and therefore, the output driver circuit 210 connected to the DQ pin 250 may be an element of an I/O circuit and may be considered as the I/O circuit.

The control logic circuit 240 may generally control operations of the first device 110. The control logic circuit 240 may store, in a parameter register 620, an example of which is described below with respect to FIG. 6, parameters for controlling the operation timing and/or memory operation of the first device 110 and provide control signals to circuits of the first device 110 such that the first device 110 operates according to the setting of operations and control parameters stored in the parameter register 620. The control logic circuit 240 may store ZQ calibration conditions uploaded to the first device 110. The control logic circuit 240 may control an operation of reading the data DQ from a memory cell, an operation of writing the data DQ to a memory cell, and/or ZQ calibration, using control signals.

The output driver circuit 210 may provide a termination resistance value of the DQ pin 250, based on a plurality of code signals, e.g., first code signal CODE1, second code signal CODE2, the third code signal CODE3, and fourth code signal CODE4, provided from the ZQ calibration control circuit 230. The pull-up and/or pull-down termination resistance value of the DQ pin 250 may be adjusted in response to code signals selected from the first to fourth code signals CODE1 to CODE4. The output driver circuit 210 may include pull-up driver circuits including heterogeneous transistors and pull-down driver circuits.

The ZQ calibration circuit 220 may perform calibration using the external resistor RZQ and a reference voltage VREF_ZQ. The calibration may include pull-up calibration and pull-down calibration and may be performed using sweep code or fixed code. The sweep code may be updated in calibration related to the ZQ pin 260 connected to the external resistor RZQ, and the fixed code may be prestored in a ZQ code register 720a, an example of which is described below with respect to FIG. 7.

The ZQ calibration control circuit 230 may generate the first to fourth code signals CODE1 to CODE4, based on the sweep code or the fixed code, according to ZQ calibration conditions. The ZQ calibration control circuit 230 may determine each of the pull-up or pull-down driver circuits of the output driver circuit 210 to be a strong driver circuit or a weak driver circuit. In embodiments, a strong driver circuit may be a driver circuit having a relatively low pull-up or pull-down resistance, and a weak driver circuit may be a driver circuit having a relatively high pull-up or pull-down resistance, but embodiments are not limited thereto. The ZQ calibration control circuit 230 may provide the first to fourth code signals CODE1 to CODE4 related to the sweep code to a strong or weak driver circuit selected by the ZQ calibration conditions stored in the control logic circuit 240 and provide the first to fourth code signals CODE1 to CODE4 related to the fixed code to an unselected strong or weak driver circuit.

Figure 3:
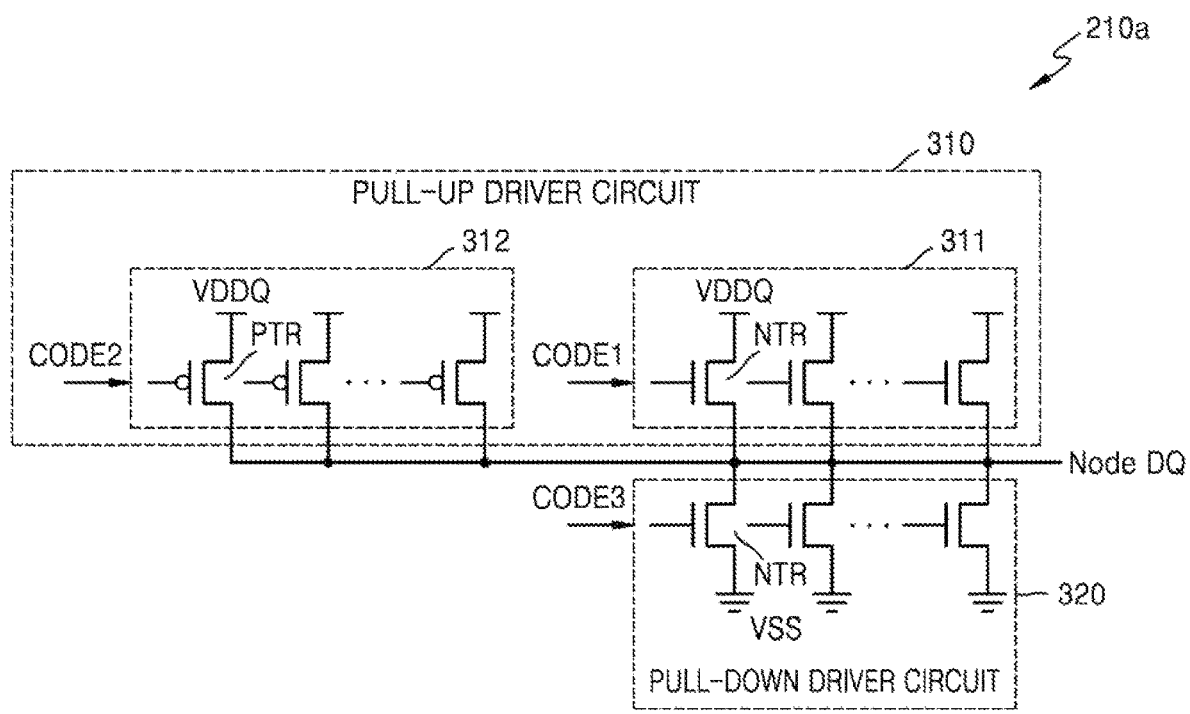
FIG. 3 is a circuit diagram of an output driver circuit according to an embodiment.

FIG. 3 is a circuit diagram of an output driver circuit 210a according to an embodiment. Hereinafter, a suffix of a reference numeral (e.g., "a" in 210a, "b" in 210b, or "c" in 210c) is used to distinguish a particular circuit referred to by the reference numeral from other circuits having the same or similar functions. Accordingly, output driver circuit 210a is an example of output driver circuit 210 of FIG. 2.

Referring to FIG. 3, the output driver circuit 210a may include a pull-up driver circuit 310, which is connected between a power supply voltage line, for example a VDDQ line, and a node DQ. In addition, the output driver circuit 210a may include a pull-down driver circuit 320, which is connected between the node DQ and a ground voltage line, for example a VSS line. The pull-up driver circuit 310 may include a first pull-up driver circuit 311 and a second pull-up driver circuit 312.

The first pull-up driver circuit 311 may include a plurality of N-channel metal-oxide semiconductor (NMOS) transistors NTR, which are connected between the VDDQ line and the node DQ and arranged in parallel. The NMOS transistors NTR may be turned on or off in response to "n" bits of the first code signal CODE1. In embodiments, a number of the NMOS transistors which may be turned on or off may correspond to a value of the "n" bits of the first code signal CODE1. For example, a number of the NMOS transistors NTR which are turned on or off may correspond to a number of the "n" bits of the first code signal CODE1 having a particular value, for example a value of "1" or a value of "0". As another example, a number of the NMOS transistors NTR which are turned on or off may correspond to a value expressed by a combination of some or all of the "n" bits of the first code signal CODE1. According to an embodiment, the NMOS transistors NTR may have the same or different size ratios related to the width of a transistor. The second pull-up driver circuit 312 may include a plurality of P-channel MOS (PMOS) transistors, which are connected between the VDDQ line and the node DQ and arranged in parallel. The PMOS transistors PTR may be turned on or off in response to "n" bits of the second code signal CODE2. According to an embodiment, the PMOS transistors PTR may have the same or different size ratios related to the width of a transistor.

A resistance value according to the on/off states of the NMOS transistors NTR of the first pull-up driver circuit 311 and the PMOS transistors PTR of the second pull-up driver circuit 312 may be provided as a pull-up termination resistance of the node DQ.

The pull-down driver circuit 320 may include a plurality of NMOS transistors NTR, which are connected between the node DQ and the VSS line and arranged in parallel. The NMOS transistors NTR may be turned on or off in response to "n" bits of the third code signal CODE3. According to an embodiment, the NMOS transistors NTR may have the same or different size ratios related to the width of a transistor. A resistance value according to the on/off states of the NMOS transistors NTR of the pull-down driver circuit 320 may be provided as a pull-down termination resistance of the node DQ.

Figure 4:
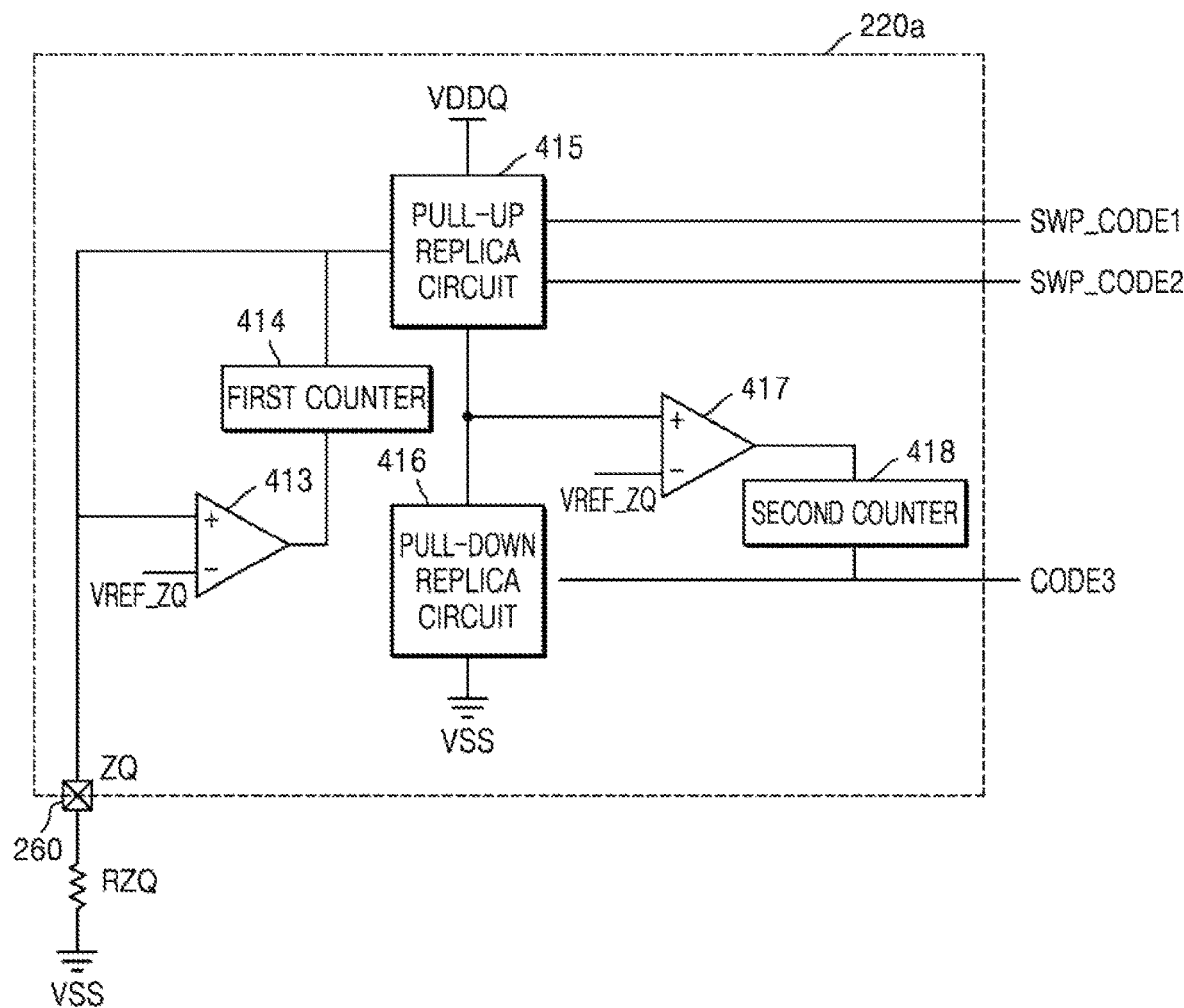
FIG. 4 is a diagram of a ZQ calibration circuit according to an embodiment.
Figure 5:
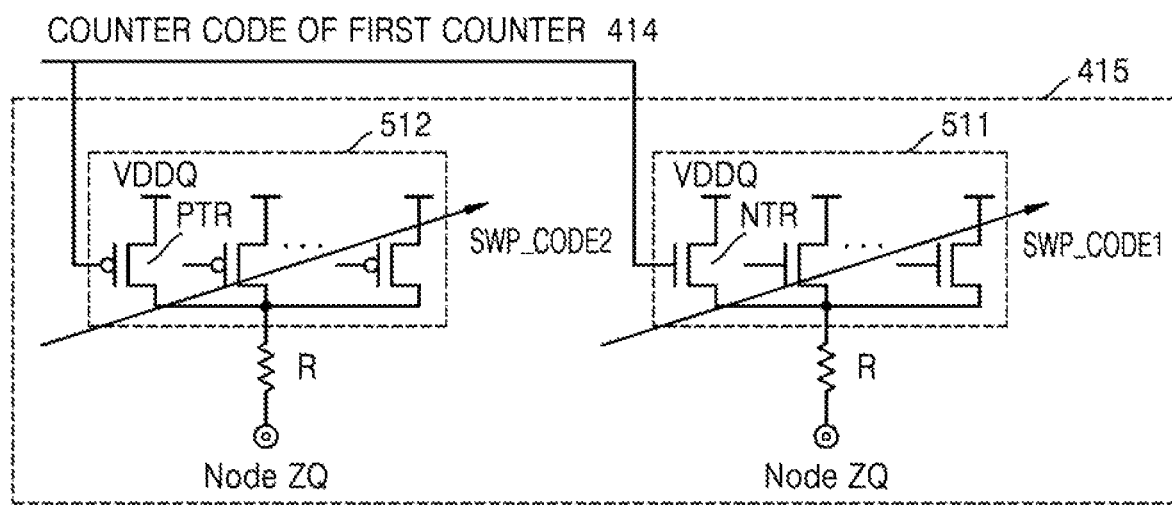
FIG. 5 is a circuit diagram of a pull-up replica circuit in FIG. 4, according to an embodiment.

FIG. 4 is a block diagram of a ZQ calibration circuit 220a according to an embodiment. \ZQ calibration circuit 220a is an example of the ZQ calibration circuit 220 in FIG. 2. FIG. 5 is a circuit diagram of a pull-up replica circuit 415 in FIG. 4, according to an embodiment.

Referring to FIG. 4, the ZQ calibration circuit 220a may include a first comparator 413, a first counter 414, the pull-up replica circuit 415, a pull-down replica circuit 416, a second comparator 417, and a second counter 418. The pull-up replica circuit 415 may have substantially the same configuration as the pull-up driver circuit 310 in FIG. 3, and the pull-down replica circuit 416 may have substantially the same configuration as the pull-down driver circuit 320 in FIG. 3.

The first comparator 413 may compare a voltage level of a node ZQ connected to the ZQ pin 260 with the level of the reference voltage VREF_ZQ and generate an up/down signal based on a comparison result. The reference voltage VREF_ZQ may be set to a voltage level making the pull-up replica circuit 415 to have a target impedance TARGET, as shown for example in FIGS. 11A and 11B. For example, the reference voltage VREF_ZQ may have a voltage level corresponding to VDDQ/2, i.e., half of the level of the power supply voltage VDDQ. The first counter 414 may be stepped up or down based on an up/down signal of the first comparator 413 and may thus output a multi-bit count value, i.e., a count code. The count code of the first counter 414 may be provided to the pull-up replica circuit 415. When the pull-up replica circuit 415 is swept by the count code, the voltage level of the node ZQ may increase or decrease.

As shown in FIG. 5, the pull-up replica circuit 415 may include a first pull-up replica circuit 511 and a second pull-up replica circuit 512. The first pull-up replica circuit 511 may include a plurality of NMOS transistors NTR and a resistor R, which are connected between the VDDQ line and the node ZQ. The NMOS transistors NTR of the first pull-up replica circuit 511 may have substantially the same configuration as the NMOS transistors NTR of the first pull-up driver circuit 311 in FIG. 3. The NMOS transistors NTR of the first pull-up replica circuit 511 are swept on or off by "n" bits of a corresponding count code of the first counter 414. The count code corresponding to the NMOS transistors NTR of the first pull-up replica circuit 511 may be referred to as a first sweep code SWP_CODE1. The resistor R may be made of a tungsten or an aluminum wire between the NMOS transistors NTR and the node ZQ.

The second pull-up replica circuit 512 may include a plurality of PMOS transistors PTR and a resistor R, which are connected between the VDDQ line and the node ZQ. The PMOS transistors PTR of the second pull-up replica circuit 512 may have substantially the same configuration as the PMOS transistors PTR of the second pull-up driver circuit 312 in FIG. 3. The PMOS transistors PTR of the second pull-up replica circuit 512 are swept on or off by "n" bits of a corresponding count code of the first counter 414. The count code corresponding to the PMOS transistors PTR of the second pull-up replica circuit 512 may be referred to as a second sweep code SWP_CODE2. The resistor R may be made of a tungsten or an aluminum wire between the PMOS transistors PTR and the node ZQ.

Referring back to FIG. 4, the first comparator 413 may perform a comparison operation until the result of comparison between the voltage level of the node ZQ and the level of the reference voltage VREF_ZQ is zero or less than a certain value, for example a threshold value, and/or until the first counter 414 reaches a dither condition in which the first counter 414 oscillates between step-up and step-down. In this pull-up calibration, when the comparison result is zero or less than the certain value and/or the dither condition is reached, the count code of the first counter 414 may be provided as the first sweep code SWP_CODE1 of the first pull-up replica circuit 511 or the second sweep code SWP_CODE2 of the second pull-up replica circuit 512. The pull-up termination resistance of the pull-up replica circuit 415 may be adjusted by the first sweep code SWP_CODE1 or the second sweep code SWP_CODE2.

The pull-up replica circuit 415 may be connected to the pull-down replica circuit 416. The second comparator 417 may compare the level of the reference voltage VREF_ZQ with the voltage level of a connecting node between the pull-up replica circuit 415 and the pull-down replica circuit 416. The second counter 418 may be stepped up or down based on an up/down signal of the second comparator 417, thereby outputting a count code. The count code of the second counter 418 may be provided to the pull-down replica circuit 416, and the pull-down replica circuit 416 may be swept by the count code of the second counter 418.

The pull-down replica circuit 416 may have substantially the same configuration as the pull-down driver circuit 320 in FIG. 3. The pull-down replica circuit 416 may perform pull-down calibration until the voltage level of the connecting node between the pull-up replica circuit 415 and the pull-down replica circuit 416 becomes equal to the level of the reference voltage VREF_ZQ through the operations of the second comparator 417 and the second counter 418. When the voltage level of the connecting node between the pull-up replica circuit 415 and the pull-down replica circuit 416 becomes equal to the level of the reference voltage VREF_ZQ, the count code of the second counter 418 may be provided as the third code signal CODE3. The pull-down termination resistance of the pull-down replica circuit 416 may be adjusted based on the third code signal CODE3.

The ZQ calibration circuit 220a described above may generate the first sweep code SWP_CODE1 or the second sweep code SWP_CODE2 by performing pull-up calibration and generate the third code signal CODE3 by performing pull-down calibration.

Figure 6:
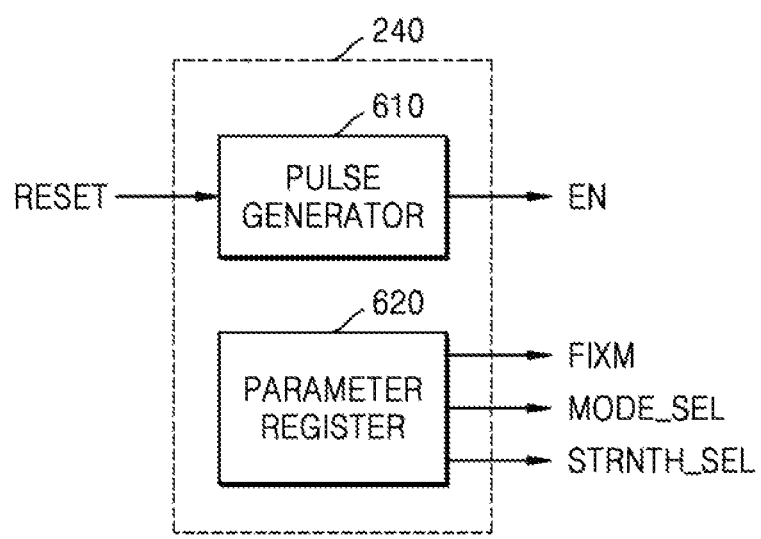
FIG. 6 is a block diagram of a control logic circuit according an embodiment.

FIG. 6 is a block diagram of the control logic circuit 240 according an embodiment.

Referring to FIG. 6, the control logic circuit 240 may include a pulse generator 610 and the parameter register 620. The pulse generator 610 may generate an enable signal EN of pulse type, based on a reset signal RESET. The reset signal RESET may be maintained at a logic low level for a certain time after the stabilization of the power supply voltage of the first device 110, and then toggled. The reset signal RESET may be configured to initialize the control logic circuit 240 for the right operation of the first device 110.

The parameter register 620 may store operating conditions applied to ZQ calibration. ZQ calibration conditions may be uploaded at power-up of the first device 110. The parameter register 620 may store a fixed mode signal FIXM, a mode selection signal MODE_SEL, and a strength selection signal STRNTH_SEL. The fixed mode signal FIXM may be provided to set default ZQ calibration.

For example, when the pull-up replica circuit 415 in FIG. 5 performs pull-up calibration, a logic low level of the fixed mode signal FIXM may be provided such that the first pull-up replica circuit 511 performs calibration by the first sweep code SWP_CODE1 and the second pull-up replica circuit 512 performs calibration by the second sweep code SWP_CODE2. A logic high level of the fixed mode signal FIXM may be provided such that the second pull-up replica circuit 512 performs calibration by the second sweep code SWP_CODE2 and the first pull-up replica circuit 511 performs calibration by a first fixed code FIX_CODE1, an example of which is described below with respect to FIG. 7.

The mode selection signal MODE_SEL may be provided to set a calibration code to be used for ZQ calibration.

For example, a logic low level of the mode selection signal MODE_SEL may be provided to perform ZQ calibration using fixed codes, e.g., first and second fixed codes FIX_CODE1 and FIX_CODE2, which may be prestored in a ZQ code register 720a. A logic high level of the mode selection signal MODE_SEL may be provided to perform ZQ calibration using the first or second sweep code SWP_CODE1 or SWP_CODE2 obtained through the pull-up calibration of the ZQ calibration circuit 220a.

The strength selection signal STRNTH_SEL is provided to indicate which of the first pull-up replica circuit 511 and the second pull-up replica circuit 512 is used when the ZQ calibration circuit 220a performs pull-up calibration, in connection with the drive strengths of the first pull-up driver circuit 311 and the second pull-up driver circuit 312 of the output driver circuit 210a.

For example, when the first pull-up driver circuit 311 has a higher driving capability than the second pull-up driver circuit 312, a logic high level of the strength selection signal STRNTH_SEL may be provided such that pull-up calibration by the first sweep code SWP_CODE1 is performed on the first pull-up replica circuit 511 having a high driving capability. A logic low level of the strength selection signal STRNTH_SEL may be provided such that pull-up calibration by the second sweep code SWP_CODE2 is performed on the second pull-up replica circuit 512 having a low driving capability.

For example, when the second pull-up driver circuit 312 has a higher driving capability than the first pull-up driver circuit 311, the logic high level of the strength selection signal STRNTH_SEL may be provided such that pull-up calibration by the second sweep code SWP_CODE2 is performed on the second pull-up replica circuit 512 having a high driving capability. The logic low level of the strength selection signal STRNTH_SEL may be provided such that pull-up calibration by the first sweep code SWP_CODE1 is performed on the first pull-up replica circuit 511 having a low driving capability.

Figure 7:
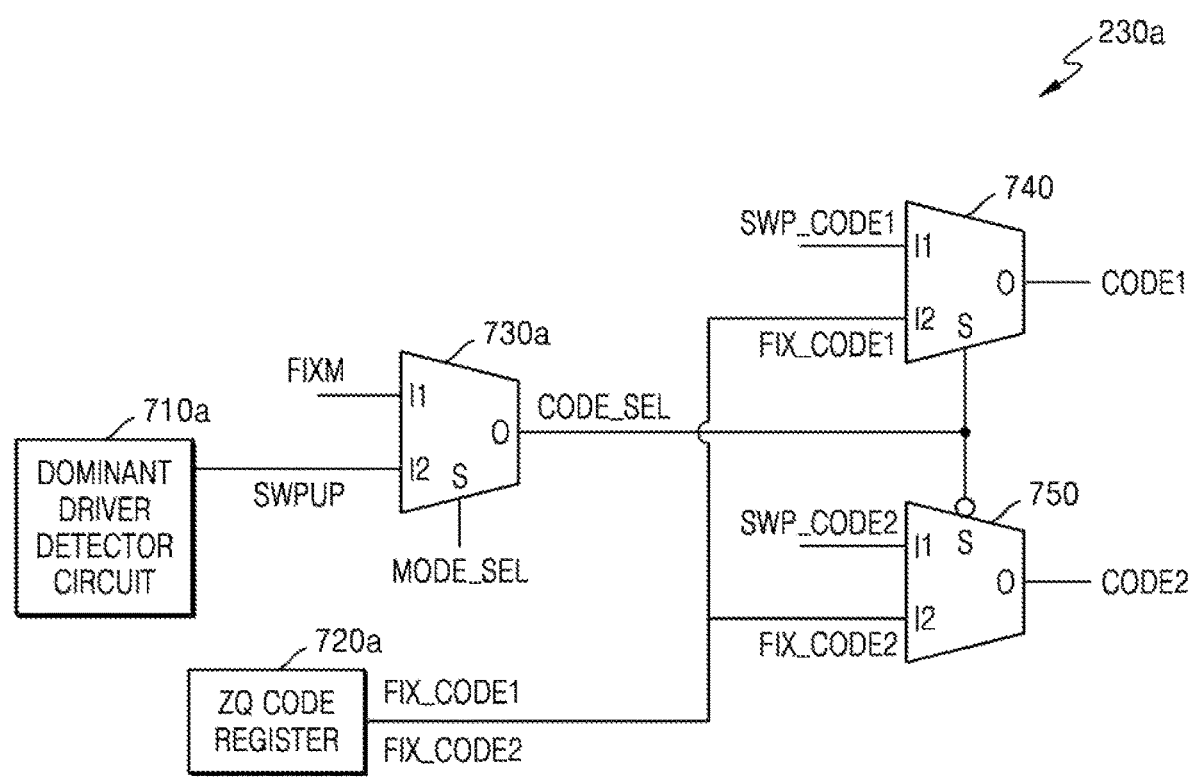
FIG. 7 is a block diagram of a impedance control (ZQ) calibration control circuit according to an embodiment.
Figure 8:
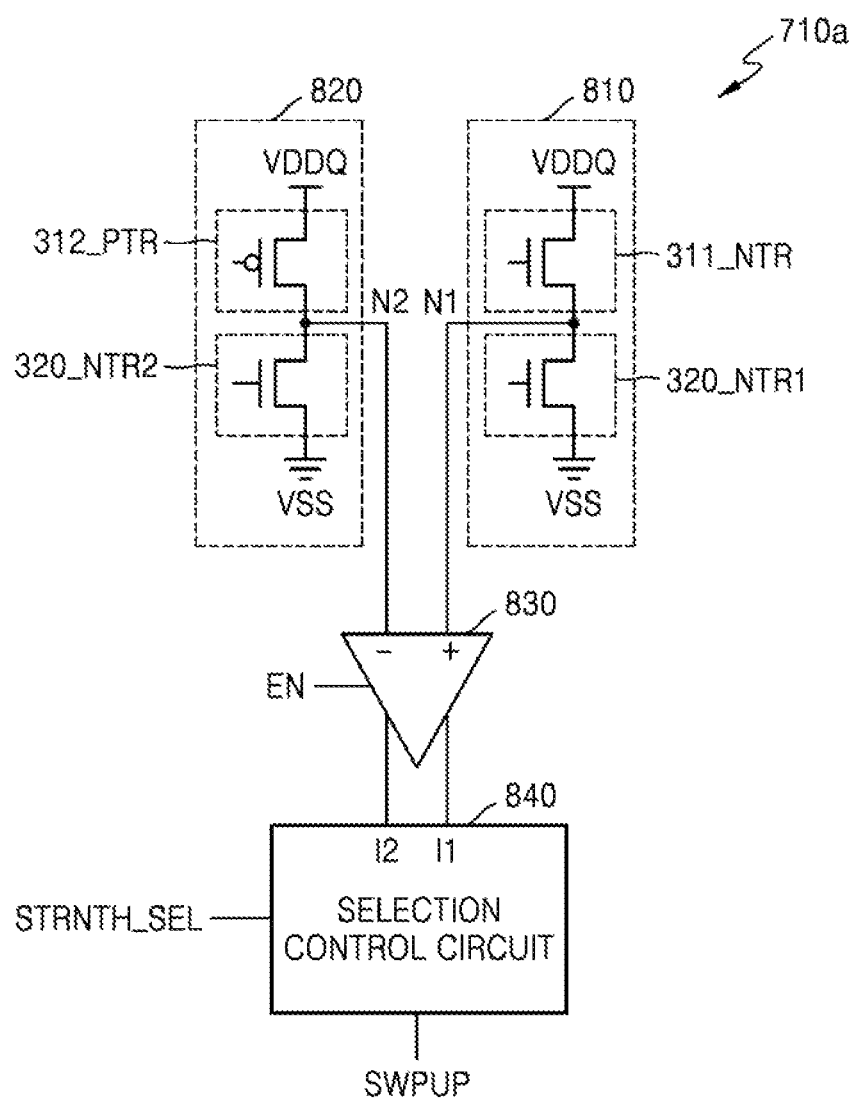
FIG. 8 is a circuit diagram of a dominant driver detector circuit in FIG. 7, according to an embodiment.

FIG. 7 is a block diagram of a ZQ calibration control circuit 230a according to an embodiment. The ZQ calibration control circuit 230a is an example of the ZQ calibration control circuit 230 of FIG. 2. FIG. 8 is a circuit diagram of a dominant driver detector circuit 710a in FIG. 7.

Referring to FIG. 7, the ZQ calibration control circuit 230a may include the dominant driver detector circuit 710a, the ZQ code register 720a, a first selector 730a, a second selector 740, and a third selector 750.

The dominant driver detector circuit 710a may determine which of the first pull-up driver circuit 311 and the second pull-up driver circuit 312 of the output driver circuit 210a is a strong driver circuit or a weak driver circuit, in response to the strength selection signal STRNTH_SEL provided from the parameter register 620 in FIG. 6. As a result of the determination, the dominant driver detector circuit 710a may generate a sweep mode signal SWPUP.

As shown in FIG. 8, the dominant driver detector circuit 710a may include a first driver circuit 810, a second driver circuit 820, a sampler 830, and a selection control circuit 840. Referring to FIG. 8, the first driver circuit 810 may include a first sample transistor 311_NTR and a second sample transistor 320_NTR1, which are connected in series between the VDDQ line and the VSS line. The first sample transistor 311_NTR may include one or some of the NMOS transistors NTR of the first pull-up driver circuit 311 in FIG. 3. The second sample transistor 320_NTR1 may include one or some of the NMOS transistors NTR of the pull-down driver circuit 320 in FIG. 3.

The second driver circuit 820 may include a third sample transistor 312_PTR and a fourth sample transistor 320_NTR2, which are connected in series between the VDDQ line and the VSS line. The third sample transistor 312_PTR may include one or some of the PMOS transistors PTR of the second pull-up driver circuit 312 in FIG. 3. The fourth sample transistor 320_NTR2 may include one or some of the NMOS transistors NTR of the pull-down driver circuit 320 in FIG. 3. According to an embodiment, the sample transistors of the first driver circuit 810 and the second driver circuit 820 may have the same size.

The sampler 830 may be connected to a first output node N1 of the first driver circuit 810 and a second output node N2 of the second driver circuit 820 and may amplify the voltage level of the first output node N1 and the voltage level of the second output node N2 in response to the enable signal EN provided from the pulse generator 610 in FIG. 6. For example, the sampler 830 may output, as a logic high level, a higher one of the voltage level of the first output node N1 and the voltage level of the second output node N2 and output, as a logic low level, a lower one of the voltage level of the first output node N1 and the voltage level of the second output node N2. The sampler 830 may provide the logic levels of the first and second output nodes N1 and N2 to the selection control circuit 840.

The selection control circuit 840 may receive the logic levels of the first and second output nodes N1 and N2, determine the logic levels of the first and second output nodes N1 and N2 in response to the strength selection signal STRNTH_SEL provided from the parameter register 620 in FIG. 6, and output the sweep mode signal SWPUP. The selection control circuit 840 may receive the voltage level of the first output node N1 through a first input I1 and the voltage level of the second output node N2 through a second input I2.

For example, if the drive strength of the first sample transistor 311_NTR of the first driver circuit 810 is greater than the drive strength of the third sample transistor 312_PTR of the second driver circuit 820, then the voltage level of the first output node N1 may be higher than the voltage level of the second output node N2, and the sampler 830 may output the voltage level of the first output node N1 in the logic high level and the voltage level of the second output node N2 in the logic low level.

Accordingly, in response to the logic high level of the strength selection signal STRNTH_SEL, the selection control circuit 840 may determine that the logic high level of the first output node N1 is applied to the first input I1 and output the sweep mode signal SWPUP at a logic low level. The sweep mode signal SWPUP at the logic low level may act as a signal instructing the calibration of the first pull-up replica circuit 511, which includes the NMOS transistors NTR in the same configuration as the first pull-up driver circuit 311 having a high driving capability. According to the sweep mode signal SWPUP at the logic low level, pull-up calibration by the first sweep code SWP_CODE1 may be performed on the first pull-up replica circuit 511 such that the pull-up termination resistance may be adjusted.

Further, in response to the logic low level of the strength selection signal STRNTH_SEL, the selection control circuit 840 may determine that the logic low level of the second output node N2 is applied to the second input I2 and output the sweep mode signal SWPUP at a logic high level. The sweep mode signal SWPUP at the logic high level may act as a signal instructing the calibration of the second pull-up replica circuit 512, which includes the PMOS transistors PTR in the same configuration as the second pull-up driver circuit 312 having a low driving capability. According to the sweep mode signal SWPUP at the logic high level, pull-up calibration by the second sweep code SWP_CODE2 may be performed on the second pull-up replica circuit 512 such that the pull-up termination resistance may be adjusted.

As another example, if the drive strength of the third sample transistor 312_PTR of the second driver circuit 820 is greater than the drive strength of the first sample transistor 311_NTR of the first driver circuit 810, then the selection control circuit 840 may output the sweep mode signal SWPUP at the logic high level in response to the logic high level of the strength selection signal STRNTH_SEL and output the sweep mode signal SWPUP at the logic low level in response to the logic low level of the strength selection signal STRNTH_SEL.

Referring back to FIG. 7, the ZQ code register 720a may store the first fixed code FIX_CODE1 and the second fixed code FIX_CODE2. The first fixed code FIX_CODE1 may be obtained in a testing stage in the manufacture of the first device 110, regarding the pull-up calibration of the first pull-up replica circuit 511, and stored in the ZQ code register 720a in advance. The second fixed code FIX_CODE2 may be obtained in a testing stage in the manufacture of the first device 110, regarding the pull-up calibration of the second pull-up replica circuit 512, and stored in the ZQ code register 720a in advance.

The first selector 730a may have a first input I1 receiving the fixed mode signal FIXM, a second input I2 receiving the sweep mode signal SWPUP, and an output O outputting a code selection signal CODE_SEL. In response to the mode selection signal MODE_SEL provided from the parameter register 620 in FIG. 6, the first selector 730a may select and output one of the fixed mode signal FIXM and the sweep mode signal SWPUP as the code selection signal CODE_SEL.

The second selector 740 may have a first input I1 receiving the first sweep code SWP_CODE1, a second input I2 receiving the first fixed code FIX_CODE1, and an output O outputting the first code signal CODE1. In response to the code selection signal CODE_SEL, the second selector 740 may select and output one of the first sweep code SWP_CODE1 and the first fixed code FIX_CODE1 as the first code signal CODE1.

The third selector 750 may have a first input I1 receiving the second sweep code SWP_CODE2, a second input I2 receiving the second fixed code FIX_CODE2, and an output O outputting the second code signal CODE2. In response to an inverted signal of the code selection signal CODE_SEL, the third selector 750 may select and output one of the second sweep code SWP_CODE2 and the second fixed code FIX_CODE2 as the second code signal CODE2.

For example, when the mode selection signal MODE_SEL is at the logic low level, the ZQ calibration control circuit 230a may select and output the fixed mode signal FIXM as the code selection signal CODE_SEL. When the fixed mode signal FIXM is at a logic low level, the code selection signal CODE_SEL may be output at a logic low level, the first sweep code SWP_CODE1 may be output as the first code signal CODE1, and the second fixed code FIX_CODE2 may be output as the second code signal CODE2. When the fixed mode signal FIXM is at a logic high level, the code selection signal CODE_SEL may be output at a logic high level, the first fixed code FIX_CODE1 may be output as the first code signal CODE1, and the second sweep code SWP_CODE2 may be output as the second code signal CODE2.

For example, when the mode selection signal MODE_SEL is at a logic high level, the ZQ calibration control circuit 230a may select and output the sweep mode signal SWPUP as the code selection signal CODE_SEL. When the sweep mode signal SWPUP is at a logic low level, the code selection signal CODE_SEL may be output at the logic low level, the first sweep code SWP_CODE1 may be output as the first code signal CODE1, and the second fixed code FIX_CODE2 may be output as the second code signal CODE2. When the sweep mode signal SWPUP is at a logic high level, the code selection signal CODE_SEL may be output at the logic high level, the first fixed code FIX_CODE1 may be output as the first code signal CODE1, and the second sweep code SWP_CODE2 may be output as the second code signal CODE2.

The first code signal CODE1 and the second code signal CODE2, which are generated by the ZQ calibration control circuit 230a, may be provided to the output driver circuit 210a of FIG. 3. The first code signal CODE1 may turn on or off the NMOS transistors NTR of the first pull-up driver circuit 311, and the second code signal CODE2 may turn on or off the PMOS transistors PTR of the second pull-up driver circuit 312. Accordingly, a pull-up termination resistance may be provided to the node DQ.

Figure 9:
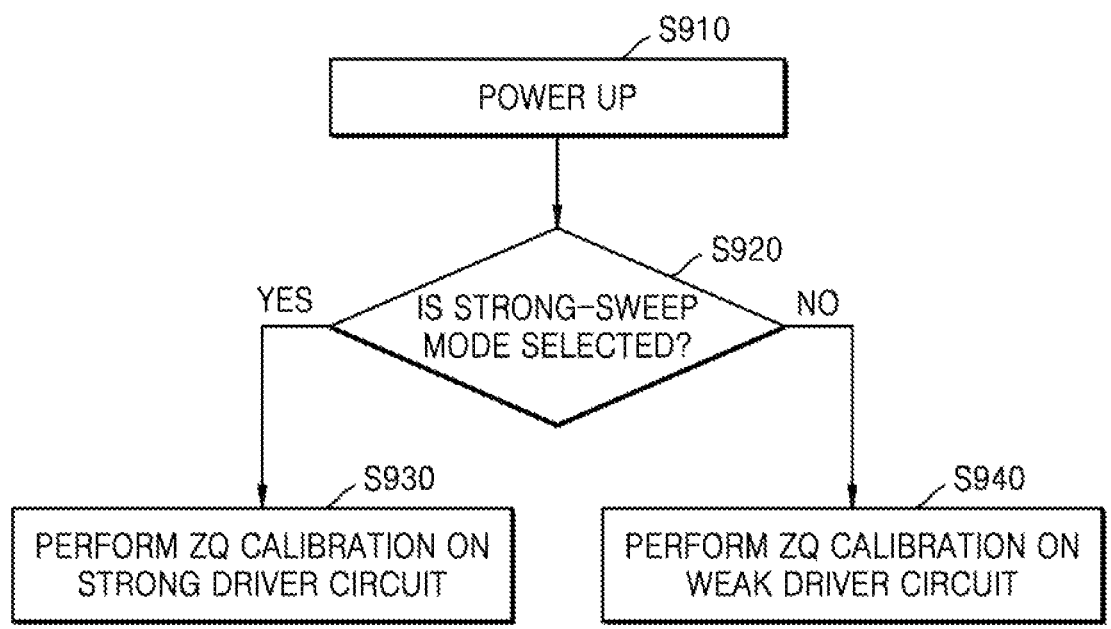
FIG. 9 is a flowchart of a ZQ calibration method according to an embodiment.

FIG. 9 is a flowchart of a ZQ calibration method according to an embodiment.

Referring to FIG. 9 in connection with FIGS. 2 to 8, electric power may be supplied to the first device 110, and the first device 110 may be powered up in operation S910. When the first device 110 is powered up and the level of the power supply voltage VDDQ driving the first device 110 is maintained constant, the first device 110 may generate the reset signal RESET. The first device 110 may be controlled to be initialized in an operable state using the reset signal RESET.

The first device 110 may determine whether a strong-sweep mode is selected for a pull-up calibration circuit (or a pull-down calibration circuit) having a high drive strength, based on signals from the parameter register 620, in operation S920. When the strong-sweep mode is selected, operation S930 may be performed. Otherwise, when the strong-sweep mode is not selected, operation S940 may be performed.

The first device 110 may perform ZQ calibration on a strong one between the first pull-up driver circuit 311 and the second pull-up driver circuit 312 of the output driver circuit 210a of FIG. 3 in operation S930. An example of this will be described in detail with reference to FIG. 10.

The first device 110 may perform ZQ calibration on a weak one between the first pull-up driver circuit 311 and the second pull-up driver circuit 312 of the output driver circuit 210a in operation S940. An example of this will be described in detail with reference to FIG. 12.

Figure 10:
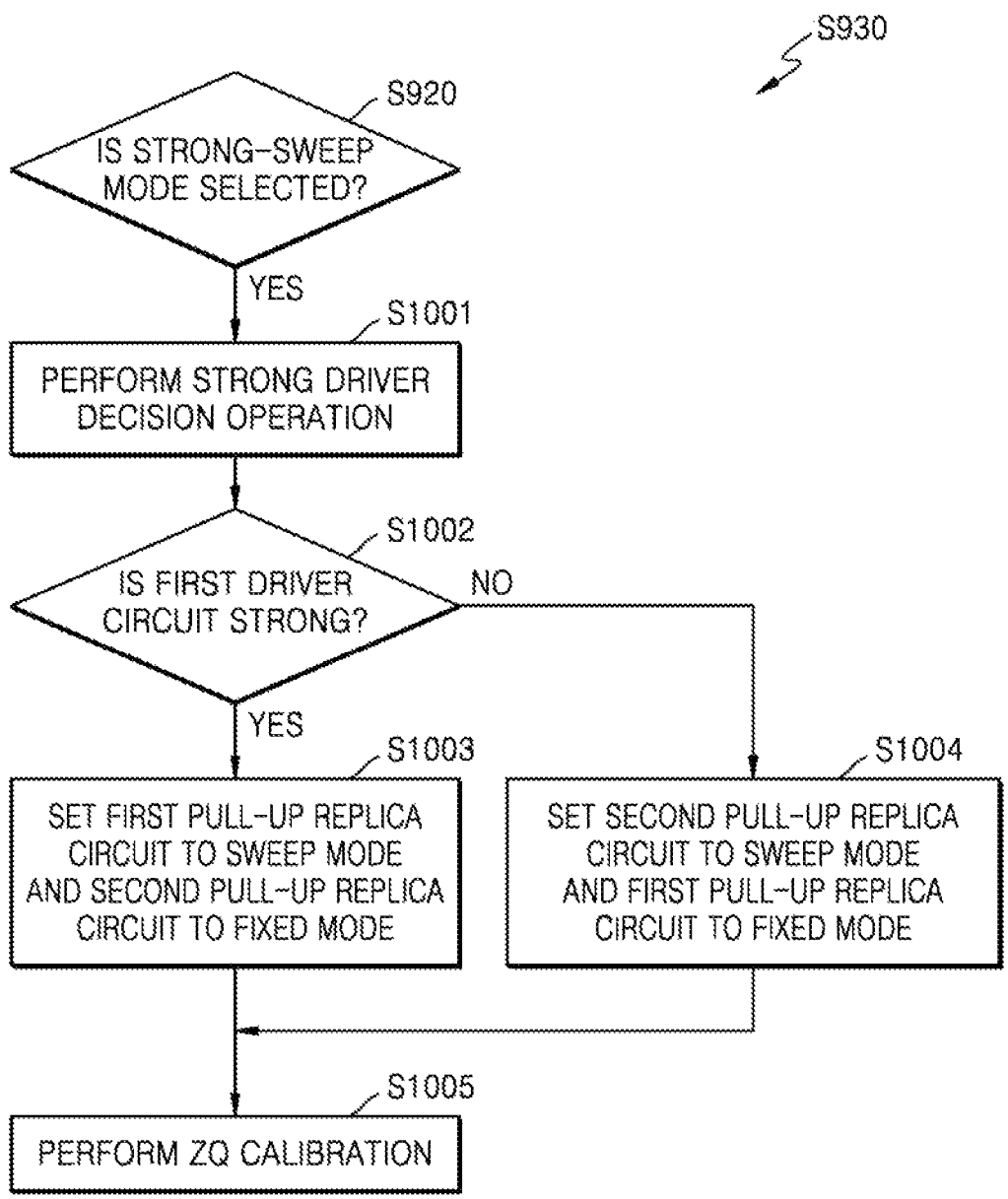
FIG. 10 is a detailed flowchart of ZQ calibration on a strong driver circuit of an output driver circuit in FIG. 9, according to an embodiment.
Figure 11A:
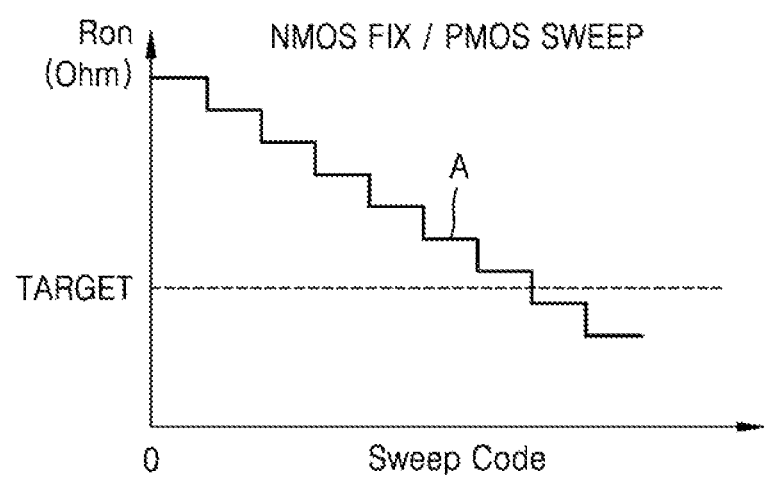
FIGS. 11A and 11B are graphs according to pull-up calibration of a pull-up replica circuit in FIGS. 4 and 5, according to an embodiment.
Figure 11B:
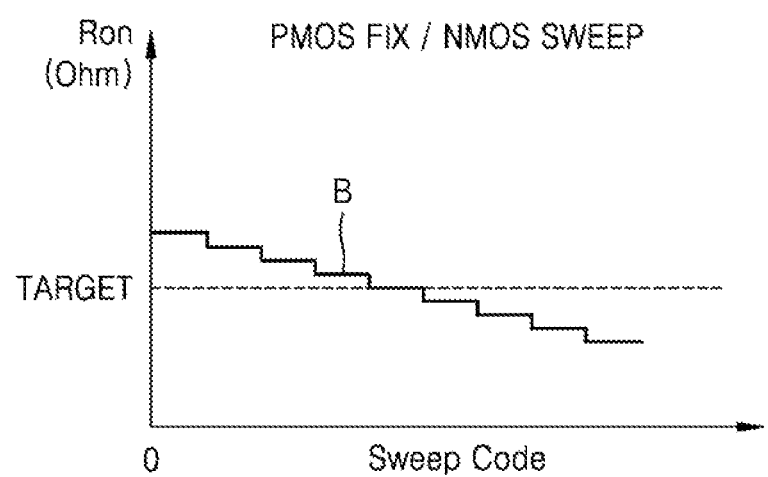
Figure 12:
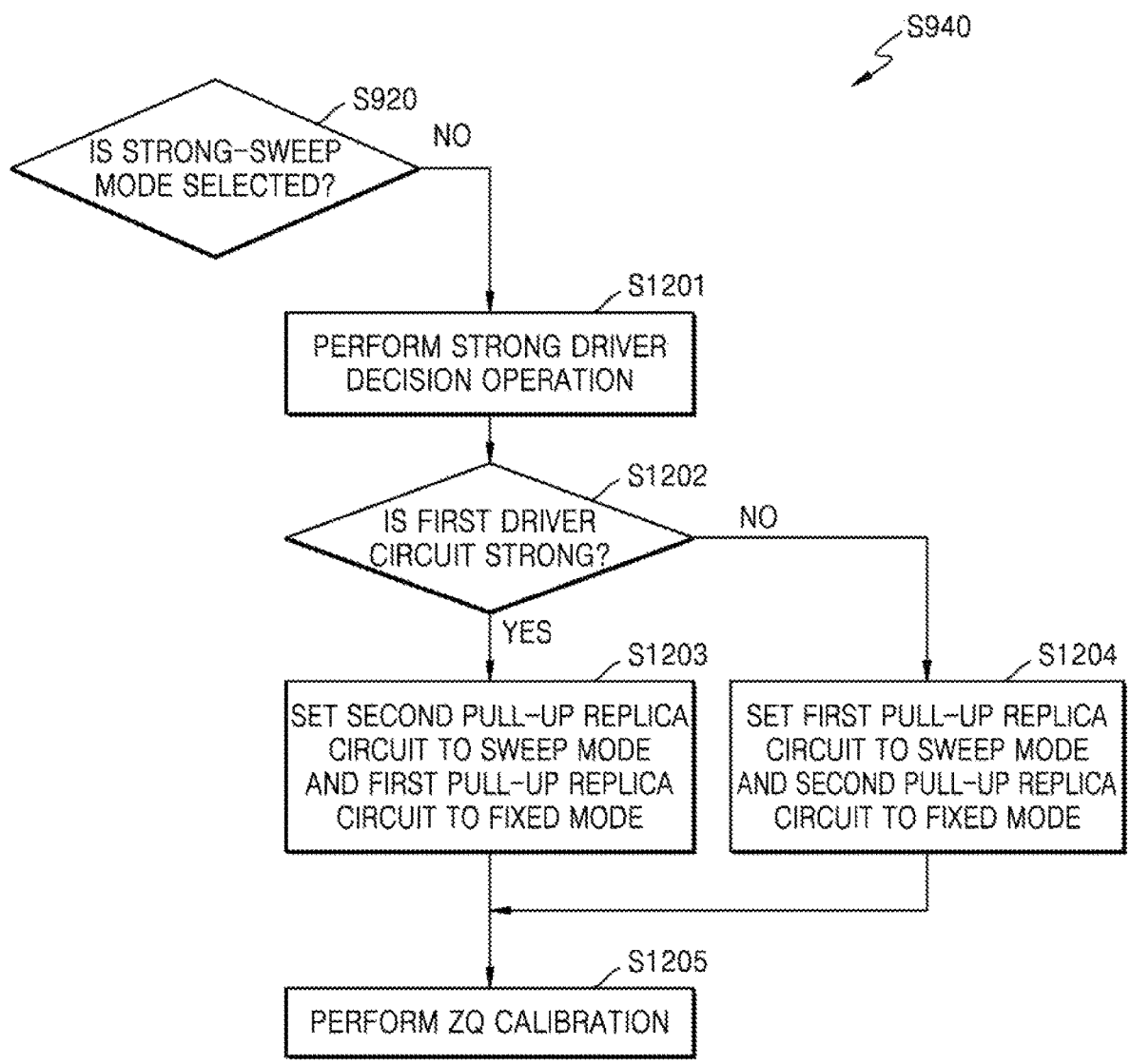
FIG. 12 is a detailed flowchart of ZQ calibration on a weak driver circuit of the output driver circuit in FIG. 9, according to an embodiment.

FIG. 10 is a detailed flowchart of an example of the ZQ calibration on a strong driver circuit of an output driver circuit 210a in FIG. 9. FIGS. 11A and 11B are graphs according to pull-up calibration of the pull-up replica circuit 415 in FIGS. 4 and 5. FIG. 12 is a detailed flowchart of an example of the ZQ calibration on a weak driver circuit of the output driver circuit 210a in FIG. 9.

Referring to FIG. 10, when the strong-sweep mode is selected in operation S920, the first device 110 may perform a strong driver decision operation with respect to the output driver circuit 210a, using the dominant driver detector circuit 710a of FIG. 8, in operation S1001. For convenience of description, it is assumed that the first driver circuit 810 has a higher driving capability than the second driver circuit 820, however embodiments are not limited thereto.

When the first driver circuit 810 is determined to be a strong driver circuit using the dominant driver detector circuit 710a in operation S1002, operation S1003 may be performed. Otherwise, when the first driver circuit 810 is not determined to be a strong driver circuit, that is, the first driver circuit is determined to be a weak driver circuit, operation S1004 may be performed.

The first device 110 may set the first pull-up replica circuit 511 of the pull-up replica circuit 415 of FIG. 5 to the sweep mode and the second pull-up replica circuit 512 of the pull-up replica circuit 415 to the fixed mode, using the ZQ calibration control circuit 230a of FIG. 7, in operation S1003.

The first pull-up replica circuit 511 related to the first driver circuit 810 determined to be a strong driver circuit may be calibrated using the first sweep code SWP_CODE1, and the second pull-up replica circuit 512 may be calibrated using the second fixed code FIX_CODE2, and accordingly, the pull-up termination resistance of the pull-up replica circuit 415 may be adjusted to the target impedance TARGET, as shown in FIG. 11A. The first sweep code SWP_CODE1 may be output as the first code signal CODE1, and the first fixed code FIX_CODE1 may be output as the second code signal CODE2.

The third code signal CODE3 may be generated by the calibration of the pull-down replica circuit 416 related to the pull-up termination resistance of the pull-up replica circuit 415 in FIG. 4. The pull-down termination resistance of the pull-down replica circuit 416 may be adjusted by the third code signal CODE3. The first code signal CODE1, the second code signal CODE2, and the third code signal CODE3 may be provided to the output driver circuit 210a of FIG. 3.

The first device 110 may set the second pull-up replica circuit 512 of the pull-up replica circuit 415 of FIG. 5 to the sweep mode and the first pull-up replica circuit 511 of the pull-up replica circuit 415 to the fixed mode, using the ZQ calibration control circuit 230a of FIG. 7, in operation S1004. The second pull-up replica circuit 512 related to the second driver circuit 820 determined to be a weak driver circuit may be calibrated using the second sweep code SWP_CODE2, and the first pull-up replica circuit 511 may be calibrated using the first fixed code FIX_CODE1, and accordingly, the pull-up termination resistance of the pull-up replica circuit 415 may be adjusted to the target impedance TARGET, as shown in FIG. 11B. The first fixed code FIX_CODE1 may be output as the first code signal CODE1, and the second sweep code SWP_CODE2 may be output as the second code signal CODE2. The third code signal CODE3 may be generated by the calibration of the pull-down replica circuit 416 related to the pull-up termination resistance of the pull-up replica circuit 415 in FIG. 4, and the pull-down termination resistance of the pull-down replica circuit 416 may be adjusted based on the third code signal CODE3.

The first device 110 may perform ZQ calibration to provide a termination resistance to the node DQ in operation S1005. In the output driver circuit 210a, a resistance value according to the on or off states of the NMOS transistors NTR of the first pull-up driver circuit 311 based on the first code signal CODE1 and the on or off states of the PMOS transistors PTR of the second pull-up driver circuit 312 based on the second code signal CODE2 may be provided as the pull-up termination resistance of the node DQ. A resistance value according to the on or off states of the NMOS transistors NTR of the pull-down driver circuit 320 based on the third code signal CODE3 may be provided as the pull-down termination resistance of the node DQ.

Referring to FIG. 12, when the strong-sweep mode is not selected in operation S920, the first device 110 may perform a strong driver decision operation with respect to the output driver circuit 210a, using the dominant driver detector circuit 710a of FIG. 8, in operation S1201. For convenience of description, it is assumed that the second driver circuit 820 has a lower driving capability than the first driver circuit 810, however embodiments are not limited thereto.

When the first driver circuit 810 is determined to be a strong driver circuit using the dominant driver detector circuit 710a in operation S1202, operation S1203 may be performed. Otherwise, when the first driver circuit 810 is determined to be a weak driver circuit, operation S1204 may be performed.

The first device 110 may set the second pull-up replica circuit 512 of the pull-up replica circuit 415 of FIG. 5 to the sweep mode and the first pull-up replica circuit 511 of the pull-up replica circuit 415 to the fixed mode, using the ZQ calibration control circuit 230a of FIG. 7, in operation S1203.

The second pull-up replica circuit 512 related to the second driver circuit 820 determined to be a weak driver circuit may be calibrated using the second sweep code SWP_CODE2, and the first pull-up replica circuit 511 may be calibrated using the first fixed code FIX_CODE1, and accordingly, the pull-up termination resistance of the pull-up replica circuit 415 may be adjusted to the target impedance TARGET, as shown in FIG. 11B. The first fixed code FIX_CODE1 may be output as the first code signal CODE1, and the second sweep code SWP_CODE2 may be output as the second code signal CODE2.

The third code signal CODE3 may be generated by the calibration of the pull-down replica circuit 416 related to the pull-up termination resistance of the pull-up replica circuit 415 in FIG. 4, and the pull-down termination resistance of the pull-down replica circuit 416 may be adjusted based on the third code signal CODE3. The first code signal CODE1, the second code signal CODE2, and the third code signal CODE3 may be provided to the output driver circuit 210a of FIG. 3.

The first device 110 may set the first pull-up replica circuit 511 of the pull-up replica circuit 415 of FIG. 5 to the sweep mode and the second pull-up replica circuit 512 of the pull-up replica circuit 415 to the fixed mode, using the ZQ calibration control circuit 230a of FIG. 7, in operation S1204. The first pull-up replica circuit 511 related to the first driver circuit 810 determined to be a strong driver circuit may be calibrated using the first sweep code SWP_CODE1, and the second pull-up replica circuit 512 may be calibrated using the second fixed code FIX_CODE2, and accordingly, the pull-up termination resistance of the pull-up replica circuit 415 may be adjusted to the target impedance TARGET, as shown in FIG. 11A. The first sweep code SWP_CODE1 may be output as the first code signal CODE1, and the first fixed code FIX_CODE1 may be output as the second code signal CODE2. The third code signal CODE3 may be generated by the calibration of the pull-down replica circuit 416 related to the pull-up termination resistance of the pull-up replica circuit 415 in FIG. 4. The pull-down termination resistance of the pull-down replica circuit 416 may be adjusted based on the third code signal CODE3.

The first device 110 may perform ZQ calibration to provide a termination resistance to the node DQ in operation S1205. In the output driver circuit 210a, a resistance value according to the on or off states of the NMOS transistors NTR of the first pull-up driver circuit 311 based on the first code signal CODE1 and the on or off states of the PMOS transistors PTR of the second pull-up driver circuit 312 based on the second code signal CODE2 may be provided as the pull-up termination resistance of the node DQ. A resistance value according to the on or off states of the NMOS transistors NTR of the pull-down driver circuit 320 based on the third code signal CODE3 may be provided as the pull-down termination resistance of the node DQ.

A calibration waveform B in FIG. 11B relatively slightly changes compared to a calibration waveform A in FIG. 11A. Accordingly, a weak driver circuit in the sweep mode may be substantially the same as having a relatively high resolution.

Figure 13:
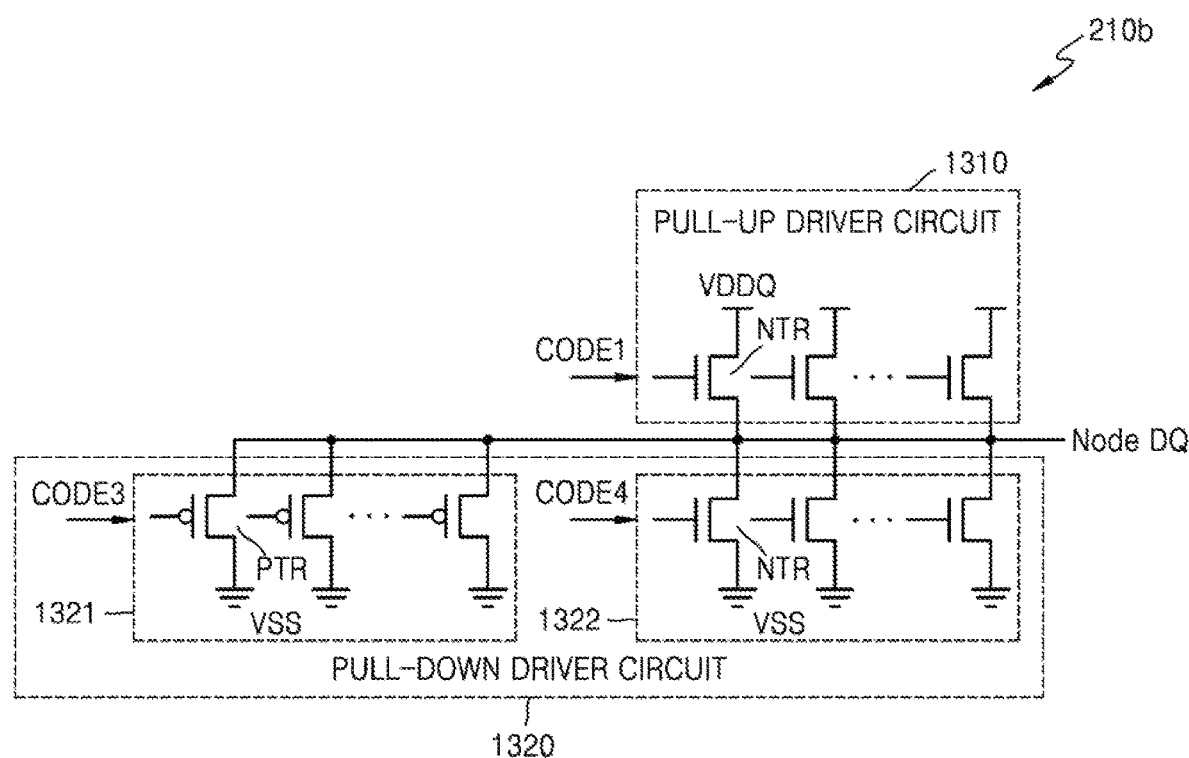
FIG. 13 is a circuit diagram of an output driver circuit according to an embodiment.

FIG. 13 is a circuit diagram of an output driver circuit 210b according to an embodiment.

Referring to FIG. 13, the output driver circuit 210b may include a pull-up driver circuit 1310, which is connected between the VDDQ line and the node DQ, and a pull-down driver circuit 1320, which is connected between the node DQ and the VSS line. The pull-down driver circuit 1320 may include a first pull-down driver circuit 1321 and a second pull-down driver circuit 1322.

The pull-up driver circuit 1310 may include a plurality of NMOS transistors NTR, which are connected between the VDDQ line and the node DQ and arranged in parallel. The NMOS transistors NTR may be turned on or off in response to "n" bits of the first code signal CODE1. A resistance value according to the on/off states of the NMOS transistors NTR of the pull-up driver circuit 1310 may be provided as the pull-up termination resistance of the node DQ.

The first pull-down driver circuit 1321 may include a plurality of PMOS transistors PTR, which are connected between the node DQ and the VSS line and arranged in parallel. The PMOS transistors PTR may be turned on or off in response to "n" bits of the third code signal CODE3. The second pull-down driver circuit 1322 may include a plurality of NMOS transistors NTR, which are connected between the node DQ and the VSS line and arranged in parallel. The NMOS transistors NTR may be turned on or off in response to "n" bits of the fourth code signal CODE4. A resistance value according to the on/off states of the PMOS transistors PTR of the first pull-down driver circuit 1321 and the NMOS transistors NTR of the second pull-down driver circuit 1322 may be provided as the pull-down termination resistance of the node DQ.

Figure 14:
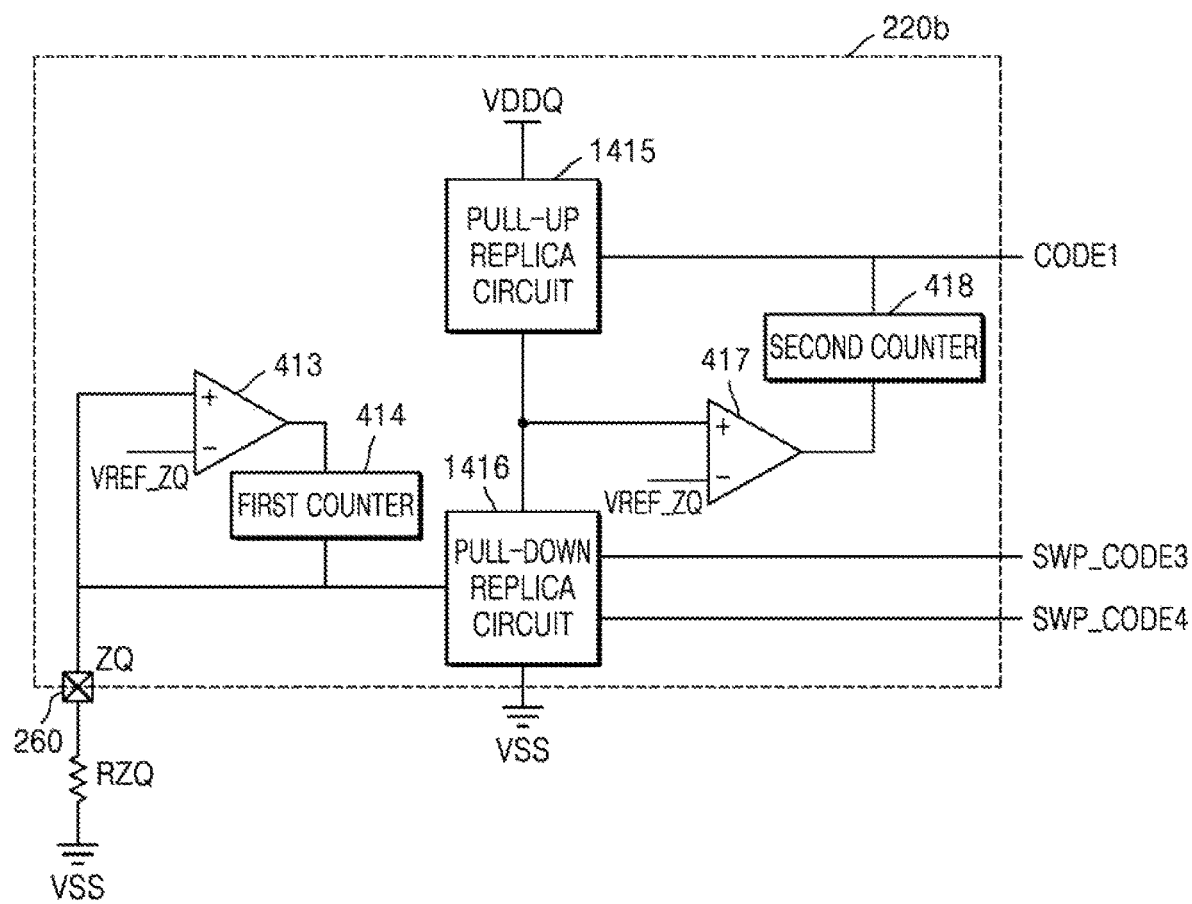
FIG. 14 is a block diagram of a ZQ calibration circuit according to an embodiment.
Figure 15:
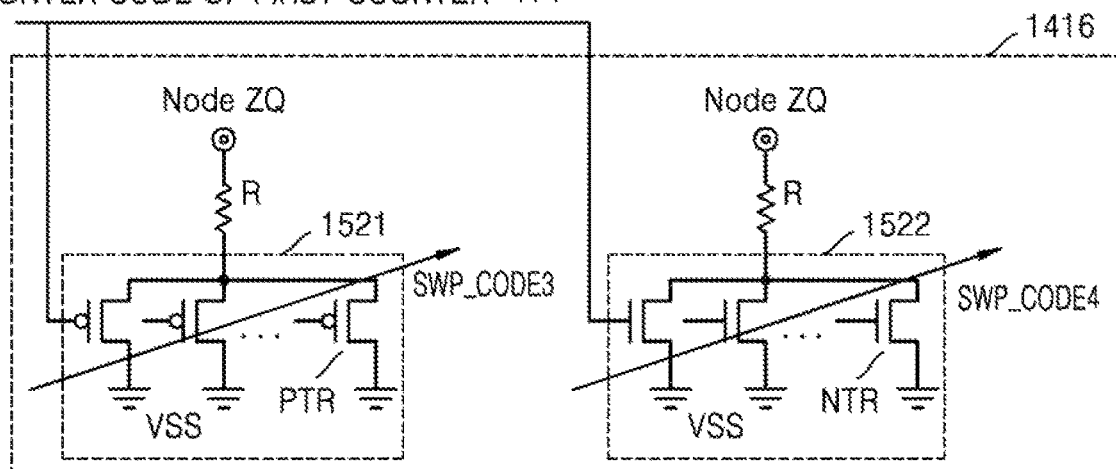
FIG. 15 is a circuit diagram of a pull-down replica circuit in FIG. 14, according to an embodiment.

FIG. 14 is a block diagram of a ZQ calibration circuit 220b according to an embodiment. The ZQ calibration circuit 220b is another example of the ZQ calibration circuit 220 in FIG. 2. FIG. 15 is a circuit diagram of a pull-down replica circuit 1416 in FIG. 14.

Referring to FIG. 14, the ZQ calibration circuit 220b may include the first comparator 413, the first counter 414, a pull-up replica circuit 1415, the pull-down replica circuit 1416, the second comparator 417, and the second counter 418. The pull-up replica circuit 1415 may have substantially the same configuration as the pull-up driver circuit 1310 in FIG. 13, and the pull-down replica circuit 1416 may have substantially the same configuration as the pull-down driver circuit 1320 in FIG. 13.

The first comparator 413 may compare the voltage level of the node ZQ connected to the ZQ pin 260 with the level of the reference voltage VREF_ZQ and generate an up/down signal based on a comparison result. The first counter 414 may be stepped up or down based on the up/down signal of the first comparator 413 and may thus output a multi-bit count value, i.e., a count code. The count code of the first counter 414 may be provided to the pull-down replica circuit 1416. When the pull-down replica circuit 1416 is swept by the count code, the voltage level of the node ZQ may increase or decrease.

As shown in FIG. 15, the pull-down replica circuit 1416 may include a first pull-down replica circuit 1521 and a second pull-down replica circuit 1522. Referring to FIG. 15, the first pull-down replica circuit 1521 may include a plurality of PMOS transistors PTR and a resistor R, which are connected between the node ZQ and the VSS line. The PMOS transistors PTR of the first pull-down replica circuit 1521 may have substantially the same configuration as the PMOS transistors PTR of the first pull-down driver circuit 1321 in FIG. 13. The PMOS transistors PTR of the first pull-down replica circuit 1521 are swept on or off by "n" bits of a corresponding count code. The count code corresponding to the PMOS transistors PTR of the first pull-down replica circuit 1521 may be referred to as a third sweep code SWP_CODE3.

The second pull-down replica circuit 1522 may include a plurality of NMOS transistors NTR and a resistor R, which are connected between the node ZQ and the VSS line. The NMOS transistors NTR of the second pull-down replica circuit 1522 may have substantially the same configuration as the NMOS transistors NTR of the second pull-down driver circuit 1322 in FIG. 13. The NMOS transistors NTR of the second pull-down replica circuit 1522 are swept on or off by "n" bits of a corresponding count code. The count code corresponding to the NMOS transistors NTR of the second pull-down replica circuit 1522 may be referred to as a fourth sweep code SWP_CODE4.

Referring back to FIG. 14, the pull-down replica circuit 1416 may perform pull-down calibration until the voltage level of the node ZQ becomes equal to the level of the reference voltage VREF_ZQ through the operations of the first comparator 413 and the first counter 414. When the voltage level of the node ZQ becomes equal to the level of the reference voltage VREF_ZQ, the count code of the first counter 414 may be provided as the third sweep code SWP_CODE3 of the first pull-down replica circuit 1521 or as the fourth sweep code SWP_CODE4 of the second pull-down replica circuit 1522. The pull-down termination resistance of the pull-down replica circuit 1416 may be adjusted based on the third sweep code SWP_CODE3 or the fourth sweep code SWP_CODE4.

The pull-down replica circuit 1416 may be connected to the pull-up replica circuit 1415. The pull-up replica circuit 1415 may have substantially the same configuration as the pull-up driver circuit 1310 in FIG. 13. The pull-up replica circuit 1415 may perform pull-up calibration until the voltage level of the connecting node between the pull-up replica circuit 1415 and the pull-down replica circuit 1416 becomes equal to the level of the reference voltage VREF_ZQ through the operations of the second comparator 417 and the second counter 418. When the voltage level of the connecting node between the pull-up replica circuit 1415 and the pull-down replica circuit 1416 becomes equal to the level of the reference voltage VREF_ZQ, the count code of the second counter 418 may be provided as the first code signal CODE1. The pull-up termination resistance of the pull-up replica circuit 1415 may be adjusted based on the first code signal CODE1.

The ZQ calibration circuit 220b described above may generate the third sweep code SWP_CODE3 or the fourth sweep code SWP_CODE4 by performing pull-down calibration and generate the first code signal CODE1 by performing pull-up calibration.

Figure 16:
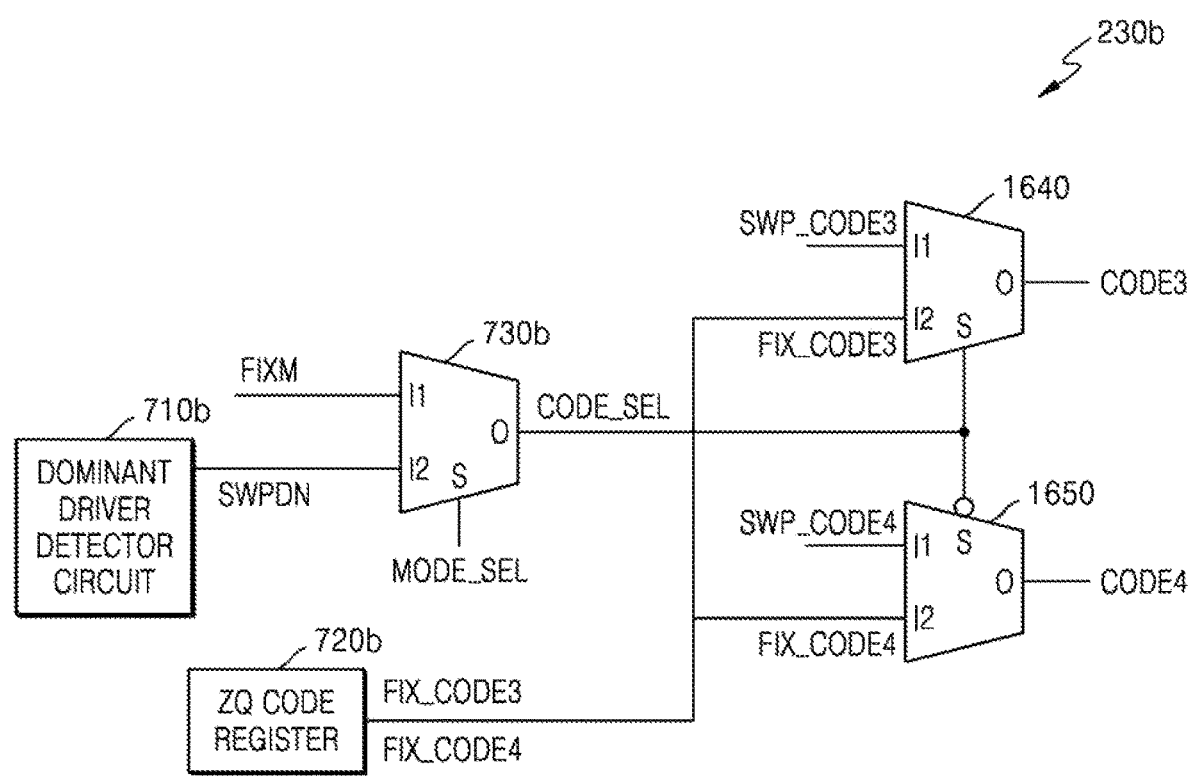
FIG. 16 is a block diagram of a ZQ calibration control circuit according to an embodiment.
Figure 17:
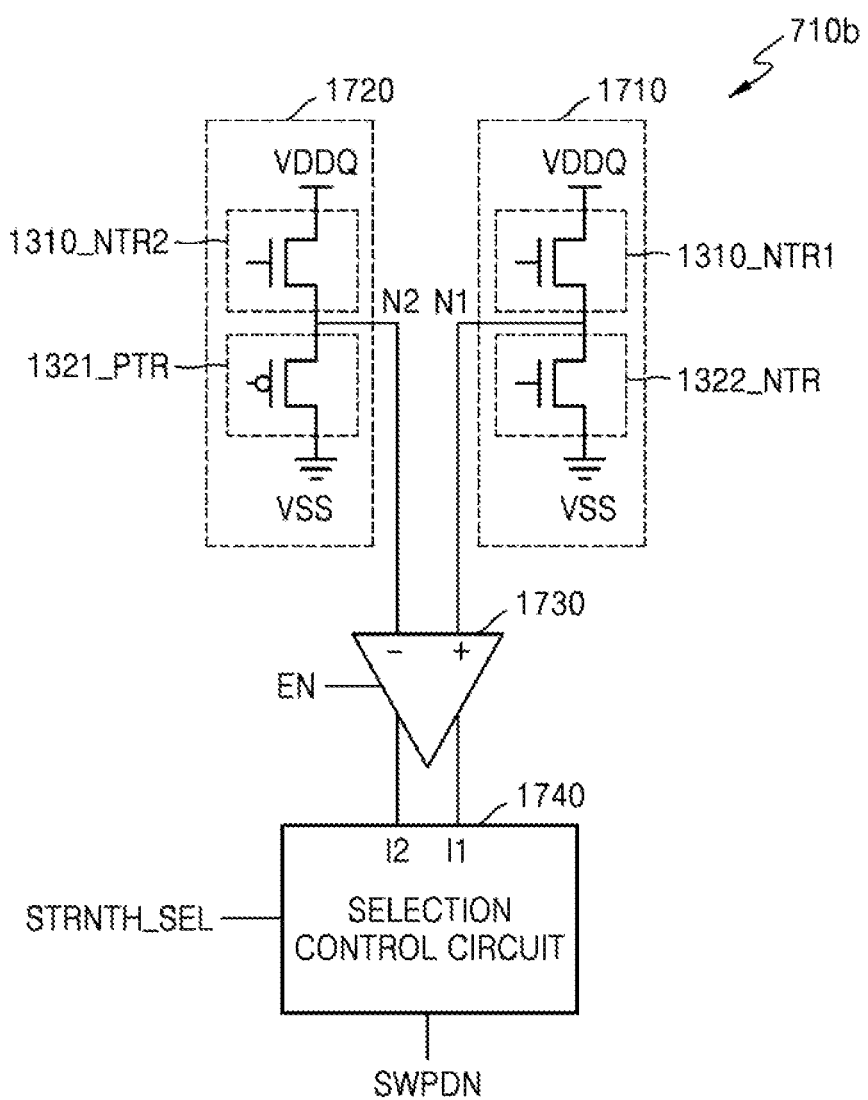
FIG. 17 is a circuit diagram of a dominant driver detector circuit in FIG. 16, according to an embodiment.

FIG. 16 is a block diagram of a ZQ calibration control circuit 230b according to an embodiment. The ZQ calibration control circuit 230b is an example of the ZQ calibration control circuit 230 of FIG. 2. FIG. 17 is a circuit diagram of a dominant driver detector circuit 710b in FIG. 16.

Referring to FIG. 16, the ZQ calibration control circuit 230b may include the dominant driver detector circuit 710b, a ZQ code register 720b, a first selector 730b, a second selector 1640, and a third selector 1650.

The dominant driver detector circuit 710b may determine which of the first pull-down driver circuit 1321 and the second pull-down driver circuit 1322 of the output driver circuit 210b is a strong driver circuit or a weak driver circuit, in response to the strength selection signal STRNTH_SEL provided from the parameter register 620 in FIG. 6. As a result of the determination, the dominant driver detector circuit 710b may generate a sweep mode signal SWPDN.

As shown in FIG. 17, the dominant driver detector circuit 710b may include a first driver circuit 1710, a second driver circuit 1720, a sampler 1730, and a selection control circuit 1740. Referring to FIG. 17, the first driver circuit 1710 may include a first sample transistor 1310_NTR1 and a second sample transistor 1322_NTR, which are connected in series between the VDDQ line and the VSS line. The first sample transistor 1310_NTR1 may include one or some of the NMOS transistors NTR of the pull-up driver circuit 1310 in FIG. 13. The second sample transistor 1322_NTR may include one or some of the NMOS transistors NTR of the second pull-down driver circuit 1322 in FIG. 13.

The second driver circuit 1720 may include a third sample transistor 1310 NTR2 and a fourth sample transistor 1321_PTR, which are connected in series between the VDDQ line and the VSS line. The third sample transistor 1310 NTR2 may include one or some of the NMOS transistors NTR of the pull-up driver circuit 1310 in FIG. 13. The fourth sample transistor 1321_PTR may include one or some of the PMOS transistors PTR of the first pull-down driver circuit 1321 in FIG. 13. According to an embodiment, the sample transistors of the first driver circuit 1710 and the second driver circuit 1720 may have the same size.

The sampler 1730 may be connected to a first output node N1 of the first driver circuit 1710 and a second output node N2 of the second driver circuit 1720 and may amplify the voltage level of the first output node N1 and the voltage level of the second output node N2 in response to the enable signal EN provided from the pulse generator 610 in FIG. 6. The sampler 1730 may provide the logic levels of the first and second output nodes N1 and N2 to the selection control circuit 1740.

The selection control circuit 1740 may receive the logic levels of the first and second output nodes N1 and N2, determine the logic levels of the first and second output nodes N1 and N2 in response to the strength selection signal STRNTH_SEL provided from the parameter register 620 in FIG. 6, and output the sweep mode signal SWPDN. The selection control circuit 1740 may receive the voltage level of the first output node N1 through a first input I1 and the voltage level of the second output node N2 through a second input I2.

For example, if the drive strength of the fourth sample transistor 1321_PTR of the second driver circuit 1720 is greater than the drive strength of the second sample transistor 1322_NTR of the first driver circuit 1710, then the voltage level of the second output node N2 may be lower than the voltage level of the first output node N1, and the sampler 1730 may output the voltage level of the second output node N2 in the logic low level and the voltage level of the first output node N1 in the logic high level.

Accordingly, in response to the logic high level of the strength selection signal STRNTH_SEL, the selection control circuit 1740 may determine that the logic high level of the first output node N1 is applied to the first input I1 and output the sweep mode signal SWPDN at a logic low level. The sweep mode signal SWPDN at the logic low level may act as a signal instructing the calibration of the first pull-down replica circuit 1521, which includes the PMOS transistors PTR in the same configuration as the first pull-down driver circuit 1321 having a high driving capability. According to the sweep mode signal SWPDN at the logic low level, pull-down calibration by the third sweep code SWP_CODE3 may be performed on the first pull-down replica circuit 1521 such that the pull-down termination resistance may be adjusted.

In response to the logic low level of the strength selection signal STRNTH_SEL, the selection control circuit 1740 may determine that the logic low level of the second output node N2 is applied to the second input I2 and output the sweep mode signal SWPDN at a logic high level. The sweep mode signal SWPDN at the logic high level may act as a signal instructing the calibration of the second pull-down replica circuit 1522, which includes the NMOS transistors NTR in the same configuration as the second pull-down driver circuit 1322 having a low driving capability. According to the sweep mode signal SWPDN at the logic high level, pull-down calibration by the fourth sweep code SWP_ CODE4 may be performed on the second pull-down replica circuit 1522 such that the pull-down termination resistance may be adjusted.

As another example, if the drive strength of the second sample transistor 1322_NTR of the first driver circuit 1710 is greater than the drive strength of the fourth sample transistor 1321_PTR of the second driver circuit 1720, then the selection control circuit 840 may output the sweep mode signal SWPDN at the logic high level in response to the logic high level of the strength selection signal STRNTH_ SEL and output the sweep mode signal SWPDN at the logic low level in response to the logic low level of the strength selection signal STRNTH_SEL.

Referring back to FIG. 16, the ZQ code register 720b may store the third fixed code FIX_CODE3 and the fourth fixed code FIX_CODE4. The third fixed code FIX_CODE3 may be obtained in a testing stage in the manufacture of the first device 110, regarding the pull-down calibration of the first pull-down replica circuit 1521, and stored in the ZQ code register 720b in advance. The fourth fixed code FIX_CODE4 may be obtained in a testing stage in the manufacture of the first device 110, regarding the pull-down calibration of the second pull-down replica circuit 1522, and stored in the ZQ code register 720b in advance.

In response to the mode selection signal MODE_SEL provided from the parameter register 620 in FIG. 6, the first selector 730b may select and output one of the fixed mode signal FIXM and the sweep mode signal SWPDN as the code selection signal CODE_SEL. In response to the code selection signal CODE_SEL, the second selector 1640 may select and output one of the third sweep code SWP_CODE3 and the third fixed code FIX_CODE3 as the third code signal CODE3. In response to the inverted signal of the code selection signal CODE_SEL, the third selector 1650 may select and output one of the fourth sweep code SWP_ CODE4 and the fourth fixed code FIX_CODE4 as the fourth code signal CODE4.

For example, when the mode selection signal MODE_ SEL is at the logic low level, the ZQ calibration control circuit 230b may select and output the fixed mode signal FIXM as the code selection signal CODE_SEL. When the fixed mode signal FIXM is at the logic low level, the code selection signal CODE_SEL may be output at the logic low level, the third sweep code SWP_CODE3 may be output as the third code signal CODE3, and the fourth fixed code FIX_CODE4 may be output as the fourth code signal CODE4. When the fixed mode signal FIXM is at a logic high level, the code selection signal CODE_SEL may be output at the logic high level, the third fixed code FIX_CODE3 may be output as the third code signal CODE3, and the fourth sweep code SWP_CODE4 may be output as the fourth code signal CODE4.

For example, when the mode selection signal MODE_ SEL is at a logic high level, the ZQ calibration control circuit 230b may select and output the sweep mode signal SWPDN as the code selection signal CODE_SEL. When the sweep mode signal SWPDN is at the logic low level, the code selection signal CODE_SEL may be output at the logic low level, the third sweep code SWP_CODE3 may be output as the third code signal CODE3, and the fourth fixed code FIX_CODE4 may be output as the fourth code signal CODE4. When the sweep mode signal SWPDN is at a logic high level, the code selection signal CODE_SEL may be output at the logic high level, the third fixed code FIX_CODE3 may be output as the third code signal CODE3, and the fourth sweep code SWP_CODE4 may be output as the fourth code signal CODE4.

The third code signal CODE3 and the fourth code signal CODE4, which are generated by the ZQ calibration control circuit 230b, may be provided to the output driver circuit 210b of FIG. 13. The third code signal CODE3 may turn on or off the PMOS transistors PTR of the first pull-down driver circuit 1321, and the fourth code signal CODE4 may turn on or off the NMOS transistors NTR of the second pull-down driver circuit 1322. Accordingly, a pull-down termination resistance may be provided to the node DQ.

Figure 18:
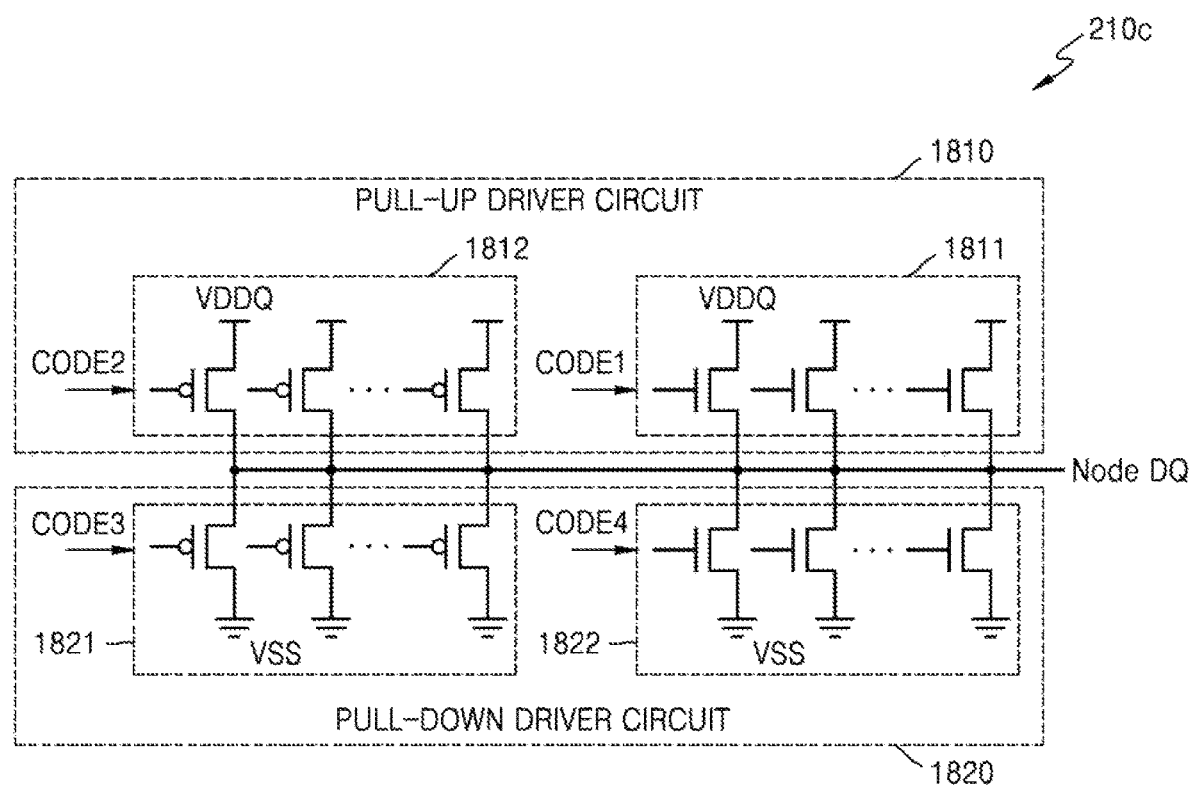
FIG. 18 is a circuit diagram of an output driver circuit according to an embodiment.

FIG. 18 is a circuit diagram of an output driver circuit 210c according to an embodiment.

Referring to FIG. 18, the output driver circuit 210c may include a pull-up driver circuit 1810, which is connected between the VDDQ line and the node DQ, and a pull-down driver circuit 1820, which is connected between the node DQ and the VSS line. The pull-up driver circuit 1810 may include a first pull-up driver circuit 1811 and a second pull-up driver circuit 1812, and the pull-down driver circuit 1820 may include a first pull-down driver circuit 1821 and a second pull-down driver circuit 1822.

The first pull-up driver circuit 1811 may include a plurality of NMOS transistors NTR, which are connected between the VDDQ line and the node DQ and arranged in parallel. The NMOS transistors NTR may be turned on or off in response to "n" bits of the first code signal CODE1. The second pull-up driver circuit 1812 may include a plurality of PMOS transistors, which are connected between the VDDQ line and the node DQ and arranged in parallel. The PMOS transistors PTR may be turned on or off in response to "n" bits of the second code signal CODE2.

A resistance value according to the on/off states of the NMOS transistors NTR of the first pull-down driver circuit 1821 and the PMOS transistors PTR of the second pull-down driver circuit 1822 may be provided as the pull-down termination resistance of the node DQ, based on the first code signal CODE1 and the second code signal CODE2.

The first pull-down driver circuit 1821 may include a plurality of PMOS transistors PTR, which are connected between the node DQ and the VSS line and arranged in parallel. The PMOS transistors PTR may be turned on or off in response to "n" bits of the third code signal CODE3. The second pull-down driver circuit 1822 may include a plurality of NMOS transistors NTR, which are connected between the node DQ and the VSS line and arranged in parallel. The NMOS transistors NTR may be turned on or off in response to "n" bits of the fourth code signal CODE4. A resistance value according to the on/off states of the PMOS transistors PTR of the first pull-down driver circuit 1821 and the NMOS transistors NTR of the second pull-down driver circuit 1822 may be provided as the pull-down termination resistance of the node DQ, based on the third code signal CODE3 and the fourth code signal CODE4.

Figure 19:
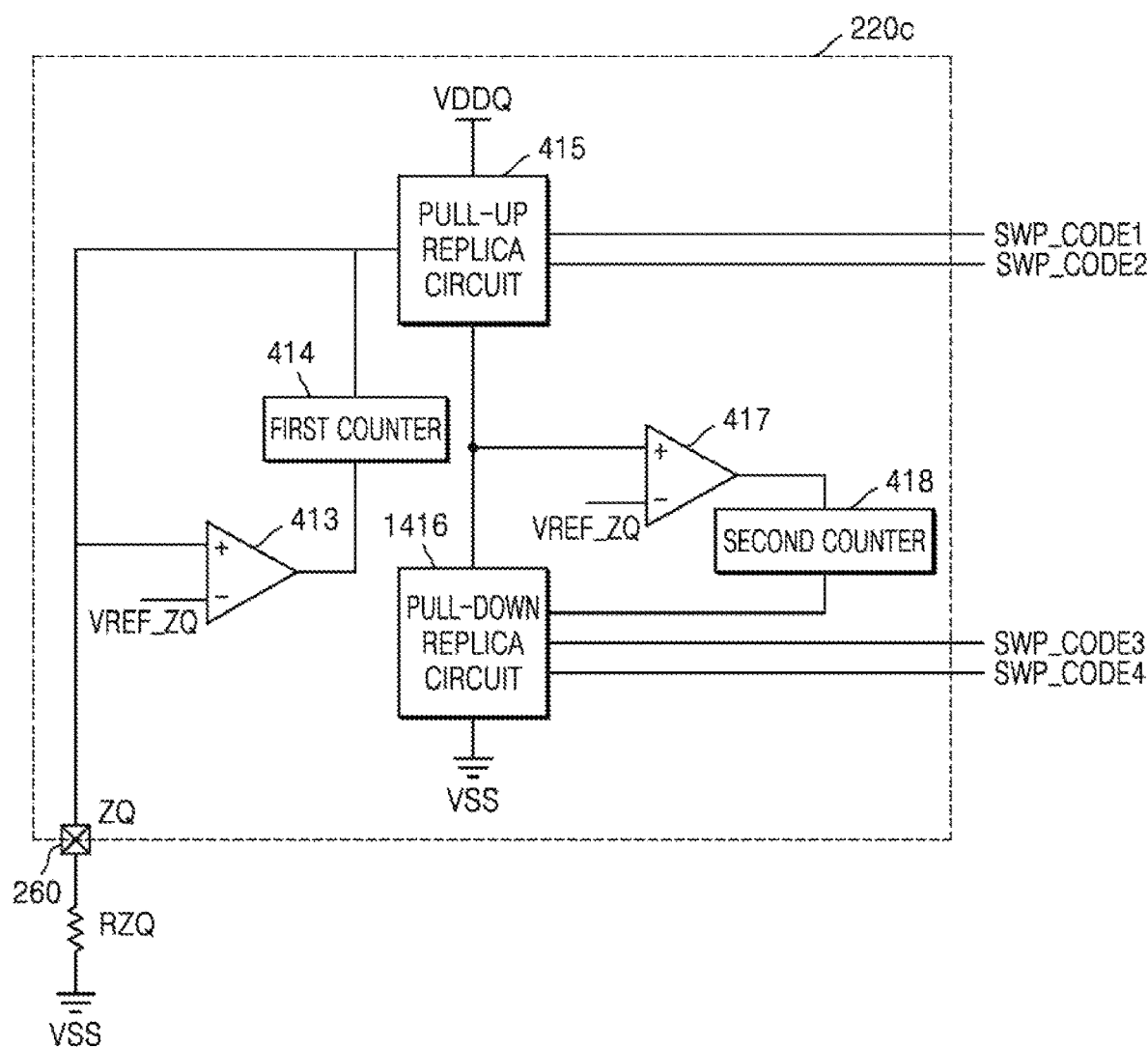
FIG. 19 is a block diagram of a ZQ calibration circuit according to an embodiment.

FIG. 19 is a block diagram of a ZQ calibration circuit 220c according to an embodiment. The ZQ calibration control circuit 220c is another example of the ZQ calibration circuit 220 in FIG. 2, in relation with the output driver circuit 210c of FIG. 18.

Referring to FIG. 19, the ZQ calibration circuit 220c may include the first comparator 413, the first counter 414, the pull-up replica circuit 415, a pull-down replica circuit 1416, the second comparator 417, and the second counter 418. The pull-up replica circuit 415 may have substantially the same configuration as the pull-up driver circuit 1810 in FIG. 18 and may include the first pull-up replica circuit 511 and the second pull-up replica circuit 512 in FIG. 5. The pull-down replica circuit 1416 may have substantially the same configuration as the pull-down driver circuit 1820 in FIG. 18 and may include the first pull-down replica circuit 1521 and the second pull-down replica circuit 1522 in FIG. 15.

The pull-up replica circuit 415 may perform pull-up calibration until the voltage level of the node ZQ becomes equal to the level of the reference voltage VREF_ZQ through the operations of the first comparator 413 and the first counter 414. When the voltage level of the node ZQ becomes equal to the level of the reference voltage VREF_ZQ, the count code of the first counter 414 may be provided as the first sweep code SWP_CODE1 of the first pull-up replica circuit 511 or the second sweep code SWP_CODE2 of the second pull-up replica circuit 512. The pull-up termination resistance of the pull-up replica circuit 415 may be adjusted based on the first sweep code SWP_CODE1 or the second sweep code SWP_CODE2.

The pull-down replica circuit 1416 may perform pull-down calibration until the voltage level of the connecting node between the pull-up replica circuit 415 and the pull-down replica circuit 1416 becomes equal to the level of the reference voltage VREF_ZQ through the operations of the second comparator 417 and the second counter 418. When the voltage level of the connecting node between the pull-up replica circuit 415 and the pull-down replica circuit 1416 becomes equal to the level of the reference voltage VREF_ZQ, the count code of the second counter 418 may be provided as the third sweep code SWP_CODE3 of the first pull-down replica circuit 1521 or the fourth sweep code SWP_CODE4 of the second pull-down replica circuit 1522. The pull-down termination resistance of the pull-down replica circuit 1416 may be adjusted based on the third sweep code SWP_CODE3 or the fourth sweep code SWP_CODE4.

Figure 20:
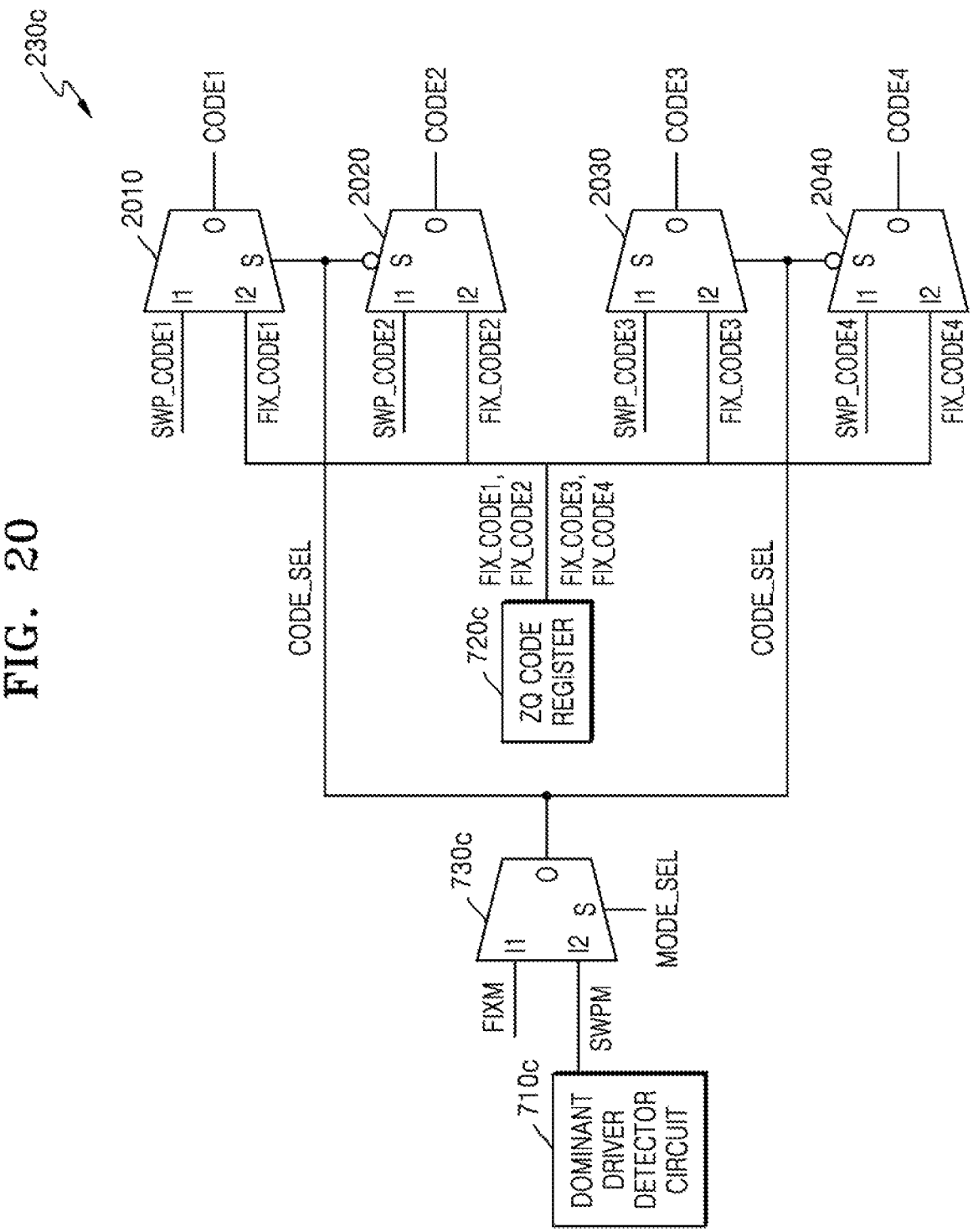
FIG. 20 is a block diagram of a ZQ calibration control circuit according to an embodiment.
Figure 21:
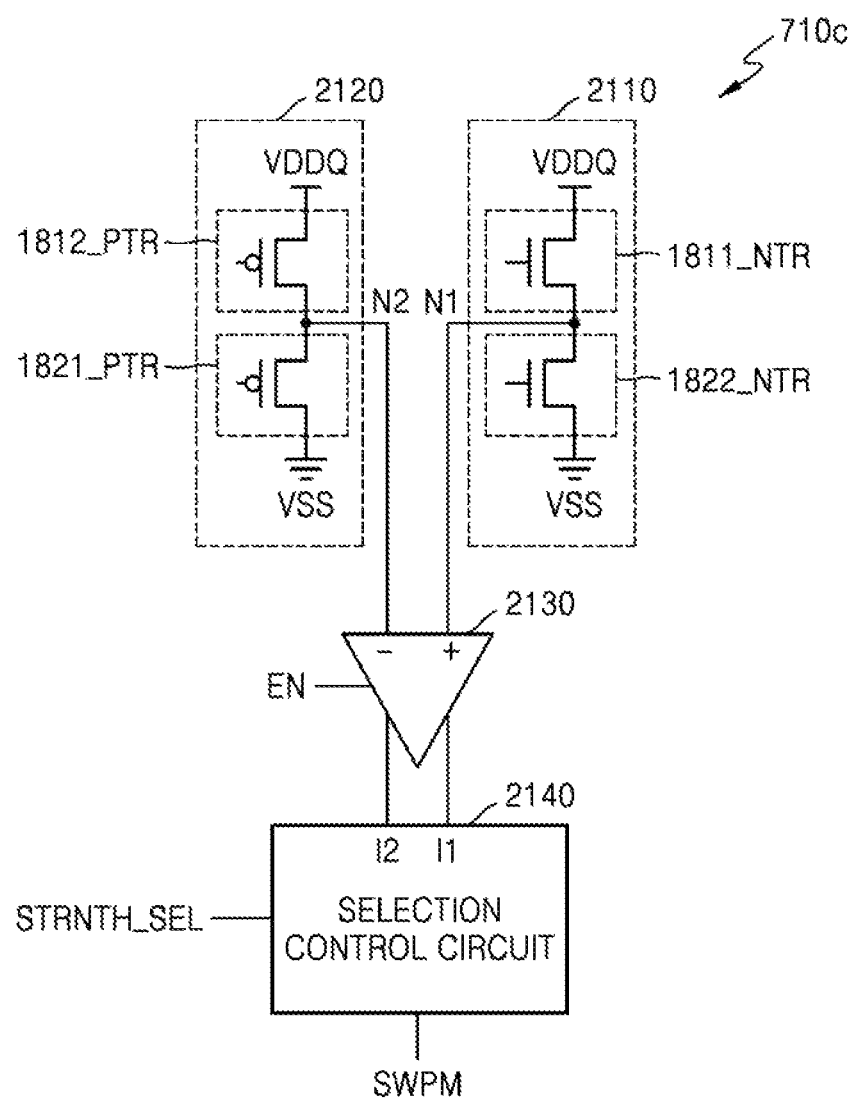
FIG. 21 is a circuit diagram of a dominant driver detector circuit in FIG. 20, according to an embodiment.

FIG. 20 is a block diagram of a ZQ calibration control circuit 230c according to an embodiment. The ZQ calibration control circuit 230c is an example of the ZQ calibration control circuit 230 of FIG. 2. FIG. 21 is a circuit diagram of a dominant driver detector circuit 710c in FIG. 20.

Referring to FIG. 20, the ZQ calibration control circuit 230c may include the dominant driver detector circuit 710c, a ZQ code register 720c, a first selector 730c, a second selector 2010, a third selector 2020, a fourth selector 2030, and a fifth selector 2040.

The dominant driver detector circuit 710c may determine which of the first pull-up driver circuit 1811 and the second pull-up driver circuit 1812 of the output driver circuit 210c is a strong driver circuit or a weak driver circuit and which of the first pull-down driver circuit 1821 and the second pull-down driver circuit 1822 of the output driver circuit 210c is a strong driver circuit or a weak driver circuit, in response to the strength selection signal STRNTH_SEL provided from the parameter register 620 in FIG. 6. As a result of the determination, the dominant driver detector circuit 710c may generate a sweep mode signal SWPM.

As shown in FIG. 21, the dominant driver detector circuit 710c may include a first driver circuit 2110, a second driver circuit 2120, a sampler 2130, and a selection control circuit 2140. Referring to FIG. 21, the first driver circuit 2110 may include a first sample transistor 1811_NTR and a second sample transistor 1822_NTR, which are connected in series between the VDDQ line and the VSS line. The first sample transistor 1811_NTR may include one or some of the NMOS transistors NTR of the first pull-up driver circuit 1811 in FIG. 18. The second sample transistor 1822_NTR may include one or some of the NMOS transistors NTR of the second pull-down driver circuit 1822 in FIG. 18.

The second driver circuit 2120 may include a third sample transistor 1812_PTR and a fourth sample transistor 1821_PTR, which are connected in series between the VDDQ line and the VSS line. The third sample transistor 1812_PTR may include one or some of the PMOS transistors PTR of the second pull-up driver circuit 1812 in FIG. 18. The fourth sample transistor 1821_PTR may include one or some of the PMOS transistors PTR of the first pull-down driver circuit 1821 in FIG. 18. According to an embodiment, the sample transistors of the first driver circuit 2110 and the second driver circuit 2120 may have the same size.

The sampler 2130 may be connected to a first output node N1 of the first driver circuit 2110 and a second output node N2 of the second driver circuit 2120 and may amplify the voltage level of the first output node N1 and the voltage level of the second output node N2 in response to the enable signal EN provided from the pulse generator 610 in FIG. 6. The sampler 2130 may provide the logic levels of the first and second output nodes N1 and N2 to the selection control circuit 2140.

The selection control circuit 2140 may receive the logic levels of the first and second output nodes N1 and N2, determine the logic levels of the first and second output nodes N1 and N2 in response to the strength selection signal STRNTH_SEL provided from the parameter register 620 in FIG. 6, and output the sweep mode signal SWPM. The selection control circuit 2140 may receive the voltage level of the first output node N1 through a first input I1 and the voltage level of the second output node N2 through a second input I2.

For example, it is assumed that the drive strength of the first sample transistor 1811_NTR of the first driver circuit 2110 is greater than the drive strength of the third sample transistor 1812_PTR of the second driver circuit 2120 and the drive strength of the fourth sample transistor 1821_PTR of the second driver circuit 2120 is greater than the drive strength of the second sample transistor 1822_NTR of the first driver circuit 2110. Accordingly, the voltage level of the first output node N1 may be higher than the voltage level of the second output node N2, and the sampler 2130 may output the voltage level of the first output node N1 in the logic high level and the voltage level of the second output node N2 in the logic low level.

In response to the logic high level of the strength selection signal STRNTH_SEL, the selection control circuit 2140 may determine that the logic high level of the first output node N1 is applied to the first input I1 and output the sweep mode signal SWPM at a logic low level. The sweep mode signal SWPM at the logic low level may act as a signal instructing the calibration of the first pull-up replica circuit 511, as shown for example in FIG. 5, which includes the NMOS transistors NTR in the same configuration as the first pull-up driver circuit 1811 having a high driving capability, and the calibration of the first pull-down replica circuit 1521, as shown for example in FIG. 15, which includes the PMOS transistors PTR in the same configuration as the first pull-down driver circuit 1821 having a high driving capability.

According to the sweep mode signal SWPM at the logic low level, pull-up calibration by the first sweep code SWP_CODE1 may be performed on the first pull-up replica circuit 511 such that the pull-up termination resistance may be adjusted, and pull-down calibration by the third sweep code SWP_CODE3 may be performed on the first pull-down replica circuit 1521 such that the pull-down termination resistance may be adjusted.

Referring back to FIG. 20, the ZQ code register 720c may store the first fixed code FIX_CODE1, the second fixed code FIX_CODE2, the third fixed code FIX_CODE3, and the fourth fixed code FIX_CODE4.

In response to the mode selection signal MODE_SEL provided from the parameter register 620 in FIG. 6, the first selector 730c may select and output one of the fixed mode signal FIXM and the sweep mode signal SWPM as the code selection signal CODE_SEL.

In response to the code selection signal CODE_SEL, the second selector 2010 may select and output one of the first sweep code SWP_CODE1 and the first fixed code FIX_CODE1 as the first code signal CODE1. In response to the inverted signal of the code selection signal CODE_SEL, the third selector 2020 may select and output one of the second sweep code SWP_CODE2 and the second fixed code FIX_CODE2 as the second code signal CODE2.

In response to the code selection signal CODE_SEL, the fourth selector 2030 may select and output one of the third sweep code SWP_CODE3 and the third fixed code FIX_CODE3 as the third code signal CODE3. In response to the inverted signal of the code selection signal CODE_SEL, the fifth selector 2040 may select and output one of the fourth sweep code SWP_CODE4 and the fourth fixed code FIX_CODE4 as the fourth code signal CODE4.

For example, when the mode selection signal MODE_SEL is at the logic low level, the ZQ calibration control circuit 230c may select and output the fixed mode signal FIXM as the code selection signal CODE_SEL. When the fixed mode signal FIXM is at the logic low level, the code selection signal CODE_SEL may be output at the logic low level, the first sweep code SWP_CODE1 may be output as the first code signal CODE1, the second fixed code FIX_CODE2 may be output as the second code signal CODE2, the third sweep code SWP_CODE3 may be output as the third code signal CODE3, and the fourth fixed code FIX_CODE4 may be output as the fourth code signal CODE4. When the fixed mode signal FIXM is at a logic high level, the code selection signal CODE_SEL may be output at the logic high level, the first fixed code FIX_CODE1 may be output as the first code signal CODE1, the second sweep code SWP_CODE2 may be output as the second code signal CODE2, the third fixed code FIX_CODE3 may be output as the third code signal CODE3, and the fourth sweep code SWP_CODE4 may be output as the fourth code signal CODE4.

As another example, when the mode selection signal MODE_SEL is at a logic high level, the ZQ calibration control circuit 230c may select and output the sweep mode signal SWPM as the code selection signal CODE_SEL. When the sweep mode signal SWPM is at the logic low level, the code selection signal CODE_SEL may be output at the logic low level, the first sweep code SWP_CODE1 may be output as the first code signal CODE3, the second fixed code FIX_CODE2 may be output as the second code signal CODE2, the third sweep code SWP_CODE3 may be output as the third code signal CODE3, and the fourth fixed code FIX_CODE4 may be output as the fourth code signal CODE4. When the sweep mode signal SWPM is at a logic high level, the code selection signal CODE_SEL may be output at the logic high level, the first fixed code FIX_CODE1 may be output as the first code signal CODE1, the second sweep code SWP_CODE2 may be output as the second code signal CODE2, the third fixed code FIX_CODE3 may be output as the third code signal CODE3, and the fourth sweep code SWP_CODE4 may be output as the fourth code signal CODE4.

The first code signal CODE1, the second code signal CODE2, the third code signal CODE3, and the fourth code signal CODE4, which are generated by the ZQ calibration control circuit 230c, may be provided to the output driver circuit 210b of FIG. 13. The first code signal CODE1 may turn on or off the NMOS transistors NTR of the first pull-up driver circuit 1811, and the second code signal CODE2 may turn on or off the PMOS transistors PTR of the second pull-up driver circuit 1812. Accordingly, a pull-up termination resistance may be provided to the node DQ.

The third code signal CODE3 may turn on or off the PMOS transistors PTR of the first pull-down driver circuit 1821, and the fourth code signal CODE4 may turn on or off the NMOS transistors NTR of the second pull-down driver circuit 1822. Accordingly, a pull-down termination resistance may be provided to the node DQ.

Figure 22:
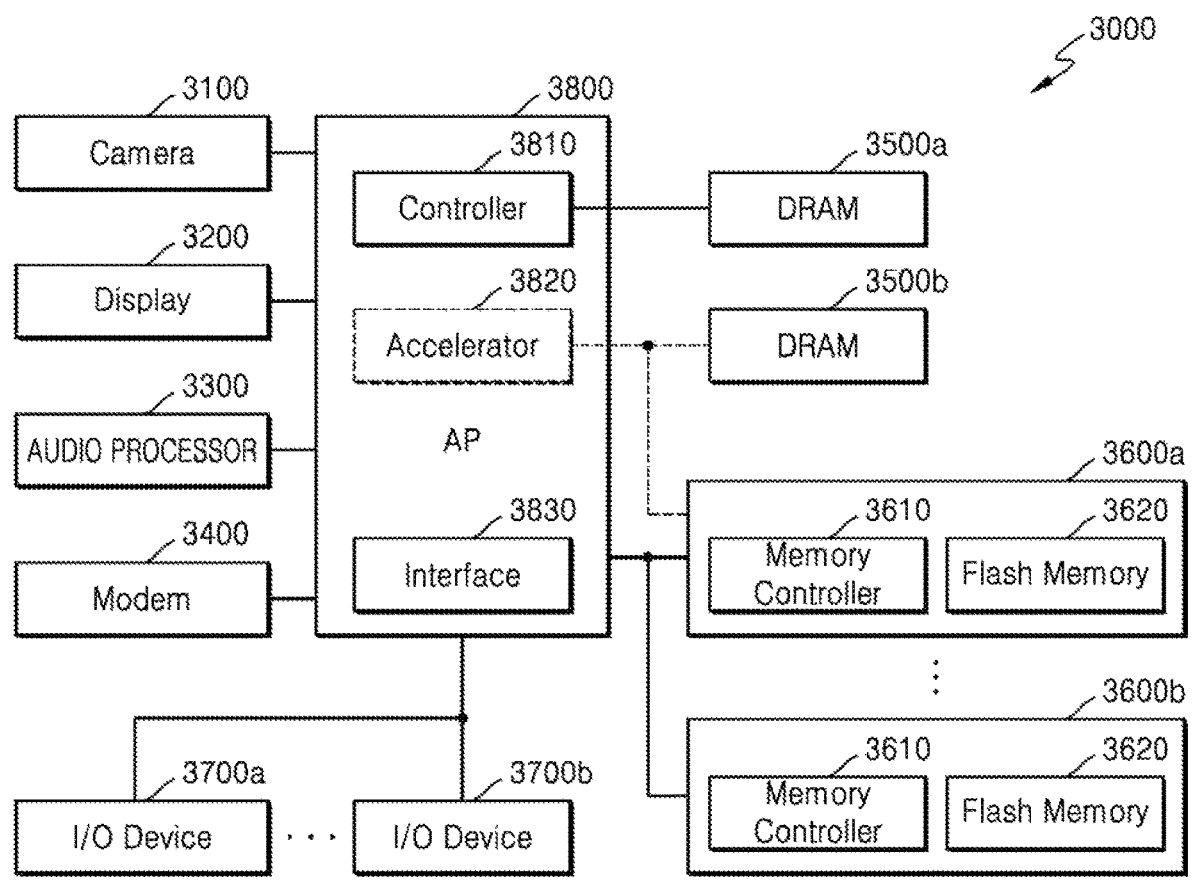
FIG. 22 is a block diagram of a system including an apparatus performing a ZQ calibration method, according to embodiments.

FIG. 22 is a block diagram of a system 3000 including a memory device including an apparatus performing a ZQ calibration method, according to embodiments.

Referring to FIG. 22, the system 3000 may include a camera 3100, a display 3200, an audio processor 3300, a modem 3400, DRAMs 3500a and 3500b, flash memory devices 3600a and 3600b, I/O devices 3700a and 3700b, and an AP 3800. The system 3000 may be implemented as a laptop computer, a mobile phone, a smartphone, a table PC, a wearable device, a healthcare device, or an Internet of things (IOT) device. The system 3000 may be implemented as a server or a PC.

The camera 3100 may shoot or capture a still image or a video under a user's control and store image/video data or transmit the image/video data to the display 3200. The audio processor 3300 may process audio data included in the contents of the flash memory devices 3600a and 3600b or a network. For wired/wireless data communication, the modem 3400 modulates a signal, transmits a modulated signal, and demodulates a received signal to restore an original signal. The I/O devices 3700a and 3700b may include devices, such as a universal serial bus (USB) storage, a digital camera, a secure digital (SD) card, a digital versatile disc (DVD), a network adapter, and a touch screen, which provide digital input and/or output functions.

The AP 3800 generally controls operations of the system 3000. The AP 3800 may control the display 3200 to display some of the contents stored in the flash memory devices 3600a and 3600b. When the AP 3800 receives user input through the I/O devices 3700a and 3700b, the AP 3800 may perform a control operation corresponding to the user input. The AP 3800 may include a controller 3810 and an interface 3830. The AP 3800 may also include an accelerator block, which is a dedicated circuit for artificial intelligence (AI) data operations, or an accelerator chip 3820 may be provided separately from the AP 3800. The DRAM 3500b may be additionally mounted on the accelerator block or the accelerator chip 3820. An accelerator is a functional block that specially performs a certain function of the AP 3800 and may include a GPU that is a functional block specially performing graphics data processing, a neural processing unit (NPU) that is a functional block specially performing AI calculation and inference, and a data processing unit (DPU) that is a functional block specially performing data transmission.

The system 3000 may include a plurality of DRAMs 3500a and 3500b. The AP 3800 may control the DRAMs 3500a and 3500b through commands and mode register setting (MRS), which comply with Joint Electron Device Engineering Council (JEDEC) standards, or may set a DRAM interface protocol and communicate with the DRAMs 3500a and 3500b to use company's unique functions, such as low voltage, high speed, reliability, and a cyclic redundancy check (CRC) function, and/or an error correction code (ECC) function. For example, the AP 3800 may communicate with the DRAM 3500a through an interface, such as LPDDR4 or LPDDR5, complying with the JEDEC standards, and the accelerator block or the accelerator chip 3820 may set a new DRAM interface protocol and communicate with the DRAM 3500b to control the DRAM 3500b, which has a higher bandwidth than the DRAM 3500a for an accelerator.

Although only the DRAMs 3500a and 3500b are illustrated in FIG. 22, embodiments are not limited thereto, and any type of memory, such as PRAM, SRAM, MRAM, RRAM, FRAM, or hybrid RAM, which satisfies the requirements of a bandwidth, a response speed, and/or a voltage for the AP 3800 or the accelerator chip 3820, may be used. The DRAMs 3500a and 3500b have relatively less latency and bandwidth than the I/O devices 3700a and 3700b or the flash memory devices 3600a and 3600b. The DRAMs 3500a and 3500b may be initialized when the system 3000 is powered on and may be loaded with an OS and application data to be used as a temporary storage of the OS and the application data or may be used as a space for execution of various kinds of software code.

The four fundamental arithmetic operations, i.e., addition, subtraction, multiplication, and division, vector operations, address operation, or fast Fourier transform (FFT) operations may be performed in the DRAMs 3500a and 3500b. Functions for executions used for inference may also be performed in the DRAMs 3500a and 3500b. At this time, the inference may be performed during a deep learning algorithm using an artificial neural network. The deep learning algorithm may include a training phase, in which a model is trained using various data, and an inference phase, in which data is recognized using the trained model. In an embodiment, an image shot by a user through the camera 3100 may undergo signal processing and may be stored in the DRAM 3500b, and the accelerator block or the accelerator chip 3820 may perform an AI data operation using data stored in the DRAM 3500b and a function used for inference to recognize the data.

The system 3000 may include a plurality of storages or flash memory devices 3600a and 3600b, which have a larger capacity than the DRAMs 3500a and 3500b. The accelerator block or the accelerator chip 3820 may perform a training phase and an AI data operation using the flash memory devices 3600a and 3600b. In an embodiment, the flash memory devices 3600a and 3600b may include a memory controller 3610 and flash memory 3620. The flash memory devices 3600a and 3600b may allow the AP 3800 and/or the accelerator chip 3820 to efficiently perform a training phase and an inference AI data operation using an arithmetic unit included in the memory controller 3610. The flash memory devices 3600a and 3600b may store images shot through the camera 3100 or data received from a data network. For example, the flash memory devices 3600a and 3600b may store augmented and/or virtual reality contents, high definition (HD) contents, or ultra-high definition (UHD) contents.

The system 3000 may transmit or receive signals for high-speed operations of the elements thereof. One or more of the camera 3100, the display 3200, the audio processor 3300, the modem 3400, the DRAMs 3500a and 3500b, the flash memory devices 3600a and 3600b, the I/O devices 3700a and 3700b, and the AP 3800 of the system 3000 may include the transmitter 112 described with reference to FIGS. 2 to 21. The transmitter 112 may determine a strong driver circuit and a weak driver circuit, which are related to an I/O circuit connected to a signal pin at power-up of the transmitter 112; provide a ZQ calibration code, which is related to a sweep code updated in a calibration operation related to the ZQ pin, to a circuit, which is selected from the strong driver circuit and the weak driver circuit according to ZQ calibration conditions; and provide a ZQ calibration code, which is related to a fixed code prestored in a register, to an unselected circuit, thereby adjusting the termination resistance of the signal pin.

While embodiments been particularly shown and described, it will be understood that various changes in form and details may be made therein without departing from the spirit and scope of the following claims.

What is claimed is:

1. An apparatus comprising:
    an input/output (I/O) circuit connected to a signal pin, the I/O circuit including a strong driver circuit and a weak driver circuit, wherein the strong driver circuit is stronger than the weak driver circuit;
    an impedance control (ZQ) calibration circuit connected to a ZQ pin, and configured to perform ZQ calibration using a sweep code or a fixed code, the ZQ pin being connected to a ZQ resistor, the sweep code being updated in a calibration operation related to the ZQ pin, and the fixed code being stored in a register; and
    a ZQ calibration control circuit connected to the I/O circuit and the ZQ calibration circuit, and configured to:
        generate a ZQ calibration code signal according to ZQ calibration conditions, based on the sweep code or the fixed code,
        select a driver circuit from among the strong driver circuit and the weak driver circuit based on the ZQ calibration conditions,
        adjust a termination resistance of the signal pin by providing a ZQ calibration code related to the sweep code to the selected driver circuit, and
        provide a ZQ calibration code related to the fixed code to an unselected circuit from among the strong driver circuit and the weak driver circuit.

2. The apparatus of claim 1, further comprising a control logic circuit configured to store a mode selection signal and a strength selection signal,
    wherein the ZQ calibration conditions are set based on the mode selection signal,
    wherein during ZQ calibration of the strong driver circuit, the sweep code or the fixed code is determined based on the mode selection signal, and
    wherein the strong driver circuit and the weak driver circuit are identified based on the strength selection signal.

3. The apparatus of claim 2, wherein the I/O circuit further includes:
    a first pull-up driver circuit including a plurality of N-channel metal-oxide semiconductor (NMOS) transistors connected between a power supply voltage line and a signal node connected to the signal pin;
    a second pull-up driver circuit including a plurality of P-channel MOS (PMOS) transistors connected between the power supply voltage line and the signal node; and a pull-down driver circuit including a plurality of NMOS transistors connected between the signal node and a ground voltage line.

4. The apparatus of claim 3, wherein the ZQ calibration circuit includes:
a first pull-up replica circuit, wherein a configuration of the first pull-up replica circuit is same as a configuration of the first pull-up driver circuit, and wherein the first pull-up replica circuit is configured to perform pull-up calibration based on a first fixed code or a first sweep code;
a second pull-up replica circuit, wherein a configuration of the second pull-up replica circuit is same as a configuration of the second pull-up driver circuit, and wherein the second pull-up replica circuit is configured to perform the pull-up calibration based on a second fixed code or a second sweep code; and
a pull-down replica circuit, wherein a configuration of the pull-down replica circuit is same as a configuration of the pull-down driver circuit, and wherein the pull-down replica circuit is connected to the first pull-up replica circuit and the second pull-up replica circuit and configured to perform pull-down calibration based on a third code.

5. The apparatus of claim 4, wherein the ZQ calibration control circuit includes:
a dominant driver detector circuit configured to identify one of the first pull-up driver circuit or the second pull-up driver circuit as the strong driver circuit based on the strength selection signal having a first logic level, and to generate a sweep mode signal; and
a first selector configured to, based on the mode selection signal, select one of the sweep mode signal and a fixed mode signal as a code selection signal, and to output the code selection signal,
wherein the fixed mode signal is provided from the control logic circuit to set default ZQ calibration.

6. The apparatus of claim 5, wherein the ZQ calibration control circuit further includes:
the register, which is configured to store the first fixed code and the second fixed code; and
a second selector configured to provide a first ZQ calibration code signal to the first pull-up driver circuit and a second ZQ calibration code signal to the second pull-up driver circuit,
wherein the second selector is further configured to:
based on the code selection signal having the first logic level, output the first sweep code as the first ZQ calibration code signal and the second fixed code as the second ZQ calibration code signal, and
based on the code selection signal having a second logic level, output the first fixed code as the first ZQ calibration code signal and the second sweep code as the second ZQ calibration code signal.

7. The apparatus of claim 2, wherein the I/O circuit further includes:
a pull-up driver circuit including a plurality of N-channel metal-oxide semiconductor (NMOS) transistors connected between a power supply voltage line and a signal node connected to the signal pin;
a first pull-down driver circuit including a plurality of P-channel MOS transistors connected between the signal node and a ground voltage line; and
a second pull-down driver circuit including a plurality of NMOS transistors connected between the signal node and the ground voltage line.

8. The apparatus of claim 7, wherein the ZQ calibration circuit includes:
a first pull-down replica circuit, wherein a configuration of the first pull-down replica circuit is same as a configuration of the first pull-down driver circuit, and wherein the first pull-down replica circuit is configured to perform pull-down calibration based on a third fixed code or a third sweep code;
a second pull-down replica circuit, wherein a configuration of the second pull-down replica circuit is same as a configuration of the second pull-down driver circuit, and wherein the second pull-down replica circuit is configured to perform the pull-down calibration based on a fourth fixed code or a fourth sweep code; and
a pull-up replica circuit, wherein a configuration of the pull-up replica circuit is same as a configuration of the pull-up driver circuit, and wherein the pull-up replica circuit is connected to the first pull-down replica circuit and the second pull-down replica circuit and configured to perform pull-up calibration based on a first code.

9. The apparatus of claim 8, wherein the ZQ calibration control circuit includes:
a dominant driver detector circuit configured to identify one of the first pull-down driver circuit or the second pull-down driver circuit as the strong driver circuit the strength selection signal having a first logic level, and to generate a sweep mode signal; and
a first selector configured to, based on the mode selection signal, select one of the sweep mode signal and a fixed mode signal as a code selection signal, and to output the code selection signal,
wherein the fixed mode signal is provided from the control logic circuit to set default ZQ calibration.

10. The apparatus of claim 9, wherein the ZQ calibration control circuit further includes:
the register, which is configured to store the third fixed code and the fourth fixed code; and
a second selector configured to provide a third ZQ calibration code signal to the first pull-down driver circuit and a fourth ZQ calibration code signal to the second pull-down driver circuit,
wherein the second selector is further configured to:
based on the code selection signal having the first logic level, output the third sweep code as the third ZQ calibration code signal and the fourth fixed code as the fourth ZQ calibration code signal, and
based on the code selection signal having a second logic level, output the third fixed code as the third ZQ calibration code signal and the fourth sweep code as the fourth ZQ calibration code signal.

11. The apparatus of claim 2, wherein the I/O circuit further includes:
a first pull-up driver circuit including a plurality of N-channel metal-oxide semiconductor (NMOS) transistors connected between a power supply voltage line and a signal node connected to the signal pin;
a second pull-up driver circuit including a plurality of P-channel MOS (PMOS) transistors connected between the power supply voltage line and the signal node;
a first pull-down driver circuit including a plurality of PMOS transistors connected between the signal node and a ground voltage line; and
a second pull-down driver circuit including a plurality of NMOS transistors connected between the signal node and the ground voltage line.

12. An apparatus comprising:
an input/output (I/O) circuit connected to a signal pin, the I/O circuit including a first driver circuit and a second driver circuit;
an impedance control (ZQ) calibration circuit connected to a ZQ pin connected to a ZQ resistor; and
a ZQ calibration control circuit connected to the I/O circuit,
wherein, based on a strength selection signal set in ZQ calibration conditions having a first logic level, the ZQ calibration control circuit is configured to:
provide a sweep code to a stronger driver circuit from among the first driver circuit and the second driver circuit, the sweep code being updated by a calibration operation of the ZQ calibration circuit, and
provide a fixed code to a weaker driver circuit from among the first driver circuit and the second driver circuit, the fixed code being stored in a register.

13. The apparatus of claim 12, wherein the ZQ calibration control circuit is further configured to provide the sweep code to the weaker driver circuit and the fixed code to the stronger driver circuit based on the strength selection signal having a logic low level.

14. The apparatus of claim 12, wherein the ZQ calibration control circuit is further configured to detect a drive strength of the first driver circuit and a drive strength of the second driver circuit at power-up of the apparatus.

15. The apparatus of claim 12, wherein the first driver circuit includes a plurality of N-channel metal-oxide semiconductor (NMOS) transistors connected between a power supply voltage line and a signal node connected to the signal pin, and
wherein the second driver circuit includes a plurality of P-channel MOS (PMOS) transistors connected between the power supply voltage line and the signal node.

16. The apparatus of claim 12, wherein the first driver circuit includes a plurality of P-channel metal-oxide semiconductor (PMOS) transistors connected between a ground voltage line and a signal node connected to the signal pin, and
wherein the second driver circuit includes a plurality of N-channel MOS (NMOS) transistors connected between the ground voltage line and the signal node.

17. The apparatus of claim 12, wherein the first driver circuit includes a plurality of N-channel metal-oxide semiconductor (NMOS) transistors and P-channel MOS (PMOS) transistors connected between a power supply voltage line and a signal node connected to the signal pin, and
wherein the second driver circuit includes a plurality of PMOS transistors and NMOS transistors connected between the power supply voltage line and the signal node.

18. An apparatus comprising:
an input/output (I/O) circuit connected to a signal pin, the I/O circuit including a first driver circuit having a first drive strength and a second driver circuit having a second drive strength different from the first drive strength;
a ZQ calibration control circuit connected to the I/O circuit,
wherein, based on the first drive strength being stronger than the second drive strength, the ZQ calibration control circuit is configured to:
determine a selected driver circuit from among the first driver circuit and the second driver circuit based on a comparison between the first drive strength and the second drive strength,
adjust a termination resistance of the signal pin by providing an adjusted ZQ calibration code to the selected driver circuit, and
provide a fixed ZQ calibration code to an unselected circuit from among the first driver circuit and the second driver circuit.

19. The apparatus of claim 18, further comprising an impedance control (ZQ) calibration circuit connected to a ZQ pin, and configured to perform a ZQ calibration operation corresponding to the ZQ pin,
wherein the adjusted ZQ calibration code is updated in the ZQ calibration operation, and the fixed ZQ calibration code is stored in a register.

20. The apparatus of claim 19, wherein based on the first drive strength being stronger than the second drive strength, the ZQ calibration control circuit is configured to determine the first driver circuit as the selected driver circuit based on a strength selection signal having a first logic level, and to determine the second driver circuit as the selected driver circuit based on the strength selection signal having a second logic level, and
wherein based on the second drive strength being stronger than the first drive strength, the ZQ calibration control circuit is configured to determine the second driver circuit as the selected driver circuit based on a strength selection signal having the first logic level, and to determine the first driver circuit as the selected driver circuit based on the strength selection signal having the second logic level.

* * * * *